US012784810B2

(12) United States Patent
Lee et al.

(10) Patent No.: US 12,784,810 B2
(45) Date of Patent: Nov. 3, 2026

(54) BIT-LINE SENSE AMPLIFIER AND SEMICONDUCTOR MEMORY DEVICE INCLUDING THE SAME

(71) Applicant: Samsung Electronics Co., Ltd., Suwon-si (KR)

(72) Inventors: Kyuseok Lee, Suwon-si (KR); Hyunju Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 18/765,195

(22) Filed: Jul. 5, 2024

(65) Prior Publication Data

US 2025/0259668 A1 Aug. 14, 2025

(30) Foreign Application Priority Data

Feb. 8, 2024 (KR) ........................ 10-2024-0019312

(51) Int. Cl.

*G11C 11/40* (2006.01)
*G11C 11/4091* (2006.01)
*G11C 11/4094* (2006.01)
*G11C 11/4096* (2006.01)

(52) U.S. Cl.

CPC ...... *G11C 11/4091* (2013.01); *G11C 11/4094* (2013.01); *G11C 11/4096* (2013.01)

(58) Field of Classification Search

CPC ............ G11C 11/4091; G11C 11/4094; G11C 11/4096; G11C 7/065; H03F 3/45744
See application file for complete search history.

(56) References Cited

U.S. PATENT DOCUMENTS

| | | | | |
|---|---|---|---|---|
| 10,586,586 | B1 | 3/2020 | Lee et al. | |
| 10,943,644 | B1 | 3/2021 | Lee | |
| 11,087,805 | B2 | 8/2021 | Lee | |
| 11,152,055 | B1 | 10/2021 | Lee | |
| 11,170,841 | B2 | 11/2021 | He et al. | |
| 11,289,151 | B2 | 3/2022 | Nagata | |
| 11,581,034 | B1 * | 2/2023 | Chi | G11C 7/08 |
| 2015/0036444 | A1 * | 2/2015 | Seo | G11C 11/4091 365/210.1 |
| 2022/0157369 | A1 * | 5/2022 | Kim | G11C 7/12 |
| 2023/0377630 | A1 | 11/2023 | Cheng | |

FOREIGN PATENT DOCUMENTS

CN 114999543 A 9/2022

* cited by examiner

*Primary Examiner* — Mohammed A Bashar
(74) *Attorney, Agent, or Firm* — Muir Patent Law, PLLC

(57) ABSTRACT

A semiconductor memory device includes a bit-line sense amplifier that includes an amplifying circuit connected to a bit-line, a complementary bit-line, a sensing bit-line, a complementary sensing bit-line, an offset cancellation circuit, an equalizer and an isolation circuit. The offset cancellation circuit connects the bit-line and the complementary bit-line to the complementary sensing bit-line and the sensing bit-line, respectively, based on an offset cancellation signal. The equalizer provides a precharge voltage to the sensing bit-line and the complementary sensing bit-line based on an equalizing signal. The isolation circuit is connected between the bit-line and the sensing bit-line and between the complementary bit-line and the complementary sensing bit-line, and connects the sensing bit-line and the complementary sensing bit-line equalized with the precharge voltage to the bit-line and the complementary bit-line, respectively, based on an isolation signal.

20 Claims, 25 Drawing Sheets

[Precharging Operation]

[Charge Sharing Operation]

[Shifting Operation]

[Sensing and Restoring Operation]

BIT-LINE SENSE AMPLIFIER AND SEMICONDUCTOR MEMORY DEVICE INCLUDING THE SAME

CROSS-REFERENCE TO RELATED APPLICATION(S)

This application claims the benefit of priority under 35 U.S.C. § 119 to Korean Patent Application No. 10-2024-0019312, filed on Feb. 8, 2024, in the Korean Intellectual Property Office, the disclosure of which is incorporated by reference herein in its entirety.

BACKGROUND

The present disclosure relates to memories, and more particularly to a bit-line sense amplifier capable of reducing power consumption and a semiconductor memory device including the bit-line sense amplifier.

A semiconductor memory device may be used to store data. Random access memory (RAM) is a volatile memory device that loses data in the absence of power. A RAM is mainly used as a main memory device of a computer. A dynamic random access memory (DRAM) is a type of RAM that is volatile and made up of memory cells. For example, a DRAM uses a transistor and a capacitor per cell. To detect data stored in the memory cells of a DRAM, bit-lines and complementary bit-lines are precharged to a precharge voltage, a charge sharing operation is performed, and a difference between a voltage level of the bit-line and a voltage level of complementary bit-line results. A sense amplifier then receives and amplifies the voltage difference between the bit-line and the complementary bit-line to detect the data stored in the memory cell.

Due to recent developments in the electronics industry, there is an increasing demand for higher functionality, higher speed, and smaller sized electronic components. Accordingly, to increase the degree of integration of the semiconductor memory device, an area of a memory cell region and a peripheral circuit region have been reduced. In addition, efforts have been made to increase the amount of data processed to speed up the data processing time.

SUMMARY

Example embodiments may provide a bit-line sense amplifier capable of reducing power consumption.

Example embodiments may provide a semiconductor memory device including a bit-line sense amplifier capable of reducing power consumption.

According to example embodiments, a semiconductor memory device includes a first memory cell connected to a first word-line and a bit-line, a second memory cell connected to a second word-line and a complementary bit-line, and a bit-line sense amplifier connected to the bit-line and the complementary bit-line. The bit-line sense amplifier includes an amplifying circuit connected to the bit-line, the complementary bit-line, a sensing bit-line, a complementary sensing bit-line, an offset cancellation circuit, an equalizer and an isolation circuit. The amplifying circuit includes a P-type amplifier and an N-type amplifier, senses a voltage difference between the bit-line and the complementary bit-line based on a first control signal and a second control signal, and adjusts a voltage of the sensing bit-line and the complementary sensing bit-line based on the voltage difference. The offset cancellation circuit connects the bit-line and the complementary bit-line to the complementary sensing bit-line and the sensing bit-line, respectively, based on an offset cancellation signal. The equalizer provides a precharge voltage to the sensing bit-line and the complementary sensing bit-line based on equalizing signal. The isolation circuit is connected between the bit-line and the sensing bit-line and between the complementary bit-line and the complementary sensing bit-line, and connects the sensing bit-line and the complementary sensing bit-line equalized with the precharge voltage to the bit-line and the complementary bit-line, respectively, based on an isolation signal.

According to example embodiments, a semiconductor memory device includes a first memory cell, a second memory cell, a bit-line sense amplifier and a timing control circuit. The first memory cell is connected to a first word-line and a bit-line. The second memory cell connected to a second word-line and a complementary bit-line. The bit-line sense amplifier is connected to the bit-line and the complementary bit-line, senses a voltage difference between the bit-line and the complementary bit-line, and amplifies the voltage difference. The timing control circuit controls an operation of the bit-line sense amplifier based on internal command signals. The bit-line sense amplifier includes an amplifying circuit, an offset cancellation circuit, an equalizer and an isolation circuit. The amplifying circuit includes a P-type amplifier connected to the bit-line and the complementary bit-line and an N-type amplifier connected to a sensing bit-line and a complementary sensing bit-line, senses the voltage difference between the bit-line and the complementary bit-line based on a first control signal and a second control signal, and adjusts a voltage of the sensing bit-line and the complementary sensing bit-line based on the voltage difference. The offset cancellation circuit connects the bit-line and the complementary bit-line to the complementary sensing bit-line and the sensing bit-line, respectively, based on an offset cancellation signal. The equalizer provides a precharge voltage to the sensing bit-line and the complementary sensing bit-line based on an equalizing signal. The isolation circuit is connected between the bit-line and the sensing bit-line and between the complementary bit-line and the complementary sensing bit-line, and connects the sensing bit-line and the complementary sensing bit-line equalized with the precharge voltage to the bit-line and the complementary bit-line, respectively, based on an isolation signal.

According to example embodiments, a semiconductor memory device includes a first memory cell connected to a first word-line and a bit-line, a second memory cell connected to a second word-line and a complementary bit-line, and a bit-line sense amplifier connected to the bit-line and the complementary bit-line. The bit-line sense amplifier includes an amplifying circuit connected to a bit-line, a complementary bit-line, a sensing bit-line, a complementary sensing bit-line, an offset cancellation circuit, an equalizer and an isolation circuit. The amplifying circuit includes a P-type amplifier and an N-type amplifier, senses a voltage difference between the bit-line and the complementary bit-line based on a first control signal and a second control signal, and adjusts a voltage of the sensing bit-line and the complementary sensing bit-line based on the voltage difference. The offset cancellation circuit connects the bit-line and the complementary bit-line to the complementary sensing bit-line and the sensing bit-line, respectively, based on an offset cancellation signal. The equalizer provides a precharge voltage to the sensing bit-line and the complementary sensing bit-line based on an equalizing signal. The isolation circuit is connected between the bit-line and the sensing bit-line and between the complementary bit-line and the complementary sensing bit-line, and connects the sensing bit-line and the complementary sensing bit-line equalized with the precharge voltage to the bit-line and the complementary bit-line, respectively, based on an isolation signal. The P-type amplifier is connected to a first supply line at a first node at which the first control signal is applied, is connected to the bit-line at a third node, and is connected to the complementary bit-line at a fourth node, The N-type amplifier is connected to a second supply line at a second node at which the second control signal is applied, is connected to the sensing bit-line at a fifth node and is connected to the complementary sensing bit-line at a sixth node. The equalizer includes a first equalizing transistor and a second equalizing transistor. The first equalizing transistor is connected between a first precharge voltage node at which the precharge voltage is applied and the fifth node, and includes a gate configured to receive the equalizing signal. The second equalizing transistor is connected between a second precharge voltage node at which the precharge voltage is applied and the sixth node, and includes a gate configured to receive the equalizing signal. The isolation circuit includes a first isolation transistor and a second isolation transistor. The first isolation transistor is connected between the third node and the fifth node, and includes a gate configured to receive the isolation signal. The second isolation transistor is connected between the fourth node and the sixth node, and includes a gate configured to receive the isolation signal.

Accordingly, in the bit-line sense amplifier according to example embodiments, the equalizer provides the precharge voltage to the sensing bit-line and the complementary sensing bit-line, the isolation circuit connected the sensing bit-line and the complementary sensing bit-line that are precharged to the bit-line and the complementary bit-line, respectively, and each of the bit-line and the complementary bit-line is connected to a drain of respective one of the isolation transistors. Therefore, a voltage level of each of the bit-line and the complementary bit-line may swing between a power supply voltage and the ground voltage when the isolation signal, which is applied to gates of the isolation transistors, has a voltage level of the power supply voltage. Accordingly, the bit-line sense amplifier may reduce power consumption.

BRIEF DESCRIPTION OF THE DRAWINGS

Example embodiments of the present disclosure will be described below in more detail with reference to the accompanying drawings.

DETAILED DESCRIPTION

Various example embodiments of the present disclosure will be described more fully hereinafter with reference to the accompanying drawings, in which example embodiments are shown.

Figure 1:
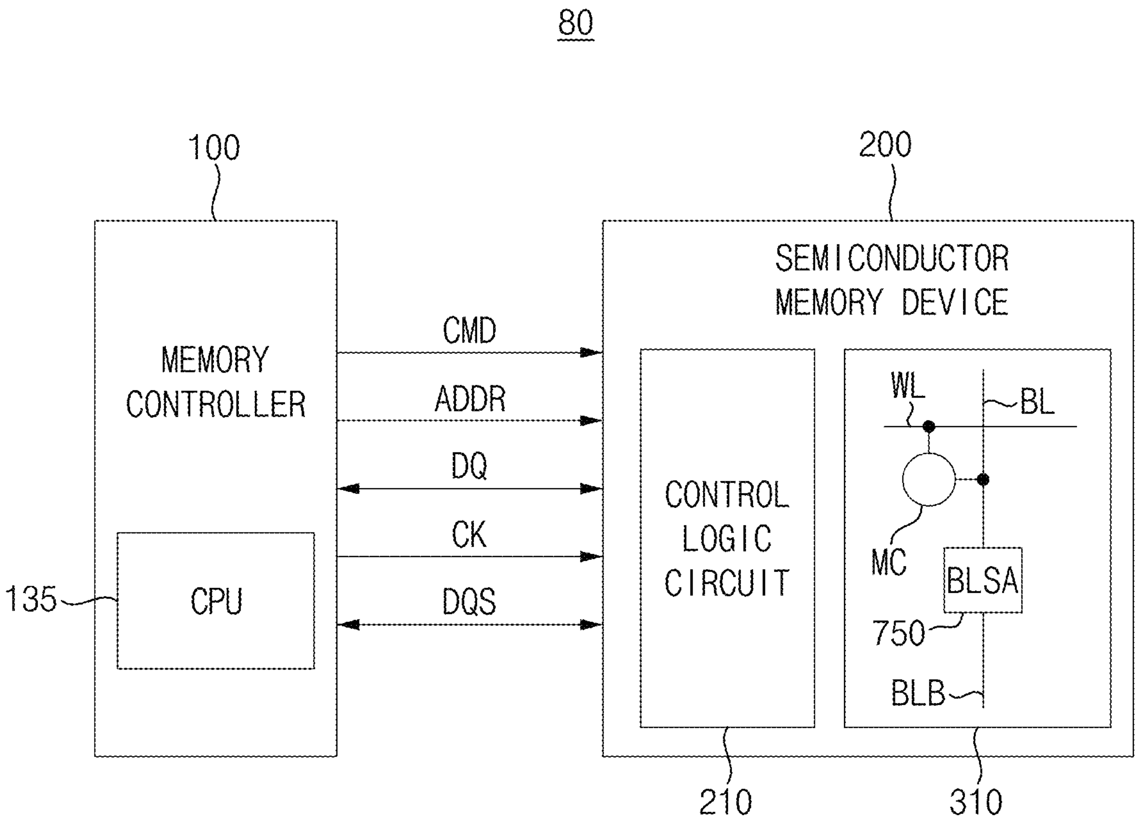
FIG. 1 is a block diagram illustrating a memory system according to example embodiments.

FIG. 1 is a block diagram illustrating a memory system according to example embodiments.

Referring to FIG. 1, a memory system 80 may include a memory controller 100 and a semiconductor memory device 200.

The memory controller 100 may control overall operation of the memory system 80. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200. In some example embodiments, the semiconductor memory device 200 is a memory device including dynamic memory cells such as a DRAM, double data rate 5 (DDR5) synchronous DRAM (SDRAM), a DDR6 SDRAM or the like.

The memory controller 100 may transmit a clock signal CK (the clock signal CK may be referred to as a command clock signal), a command CMD, and an address (signal) ADDR to the semiconductor memory device 200. Herein, for convenience of description, the terms of a clock signal CK, a command CMD, and an address ADDR and the terms of clock signals CK, commands CMD, and addresses ADDR may be used interchangeably. The memory controller 100 may transmit a data strobe signal DQS to the semiconductor memory device 200 when the memory controller 100 writes data signal DQ in the semiconductor memory device 200. The semiconductor memory device 200 may transmit a data strobe signal DQS to the memory controller 100 when the memory controller 100 reads data signal DQ from the semiconductor memory device 200. The address ADDR may be accompanied by the command CMD and the address ADDR may be referred to as an access address.

The memory controller 100 may include a central processing unit (CPU) 135 that controls overall operation of the memory controller 100.

The semiconductor memory device 200 may include a memory cell array 310 that stores the data signal DQ and a control logic circuit 210.

The control logic circuit 210 may control operations of the semiconductor memory device 200. The memory cell array 310 may include a plurality of memory cell rows and each of the memory cell rows may include a plurality of (volatile) memory cells. The memory cell array 310 may include a bit-line sense amplifier BLSA 750.

A memory cell MC may be connected to a word-line WL and a bit-line BL and the bit-line sense amplifier 750 may be connected to the memory cells MC through the bit-line BL and a complementary bit-line BLB.

The bit-line sense amplifier 750 may include an amplifying circuit that includes a P-type amplifier connected to the bit-line and BL and the complementary bit-line BLB and an N-type amplifier connected to a sensing bit-line and a complementary sensing bit-line, and an isolation circuit connected between the bit-line and the sensing bit-line and between the complementary bit-line and the complementary sensing bit-line. The isolation circuit may connect the sensing bit-line and the complementary sensing bit-line to the bit-line and the complementary bit-line, respectively, based on an isolation signal. Because the bit-line and the complementary bit-line are connected to drains of isolation transistors in the isolation circuit, a voltage level of each of the bit-line and the complementary bit-line may swing between a power supply voltage and a ground voltage when the isolation signal, which is applied to gates of the isolation transistors, has a voltage level of the power supply voltage.

The semiconductor memory device 200 performs a refresh operation periodically due to charge leakage of memory cells storing data. Due to scale down of the manufacturing process of the semiconductor memory device 200, the storage capacitance of the memory cell is decreased and the refresh period is shortened. The refresh period is further shortened because the entire refresh time is increased as the memory capacity of the semiconductor memory device 200 is increased.

To compensate degradation of adjacent memory cells due to the intensive access to a particular row or a hammer address, a target row refresh (TRR) scheme was adopted and an in-memory refresh scheme is developed to reduce the burden of the memory controller. The memory controller is totally responsible for the hammer refresh operation in the TRR scheme and the semiconductor memory device is totally responsible for the hammer refresh operation in the in-memory refresh scheme.

Figure 2:
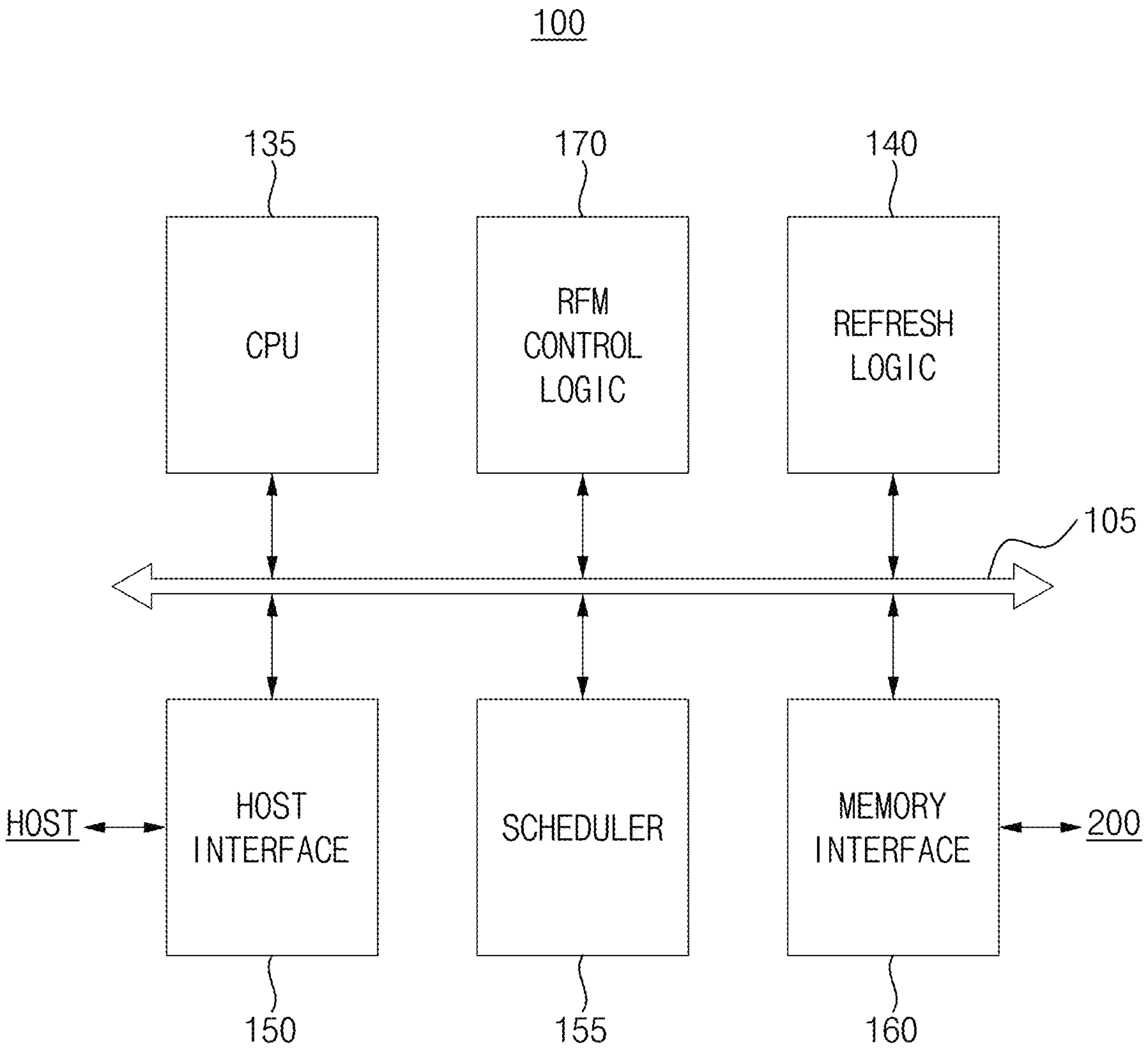
FIG. 2 is a block diagram illustrating an example of a memory controller in FIG. 1 according to example embodiments.

FIG. 2 is a block diagram illustrating an example of the memory controller in FIG. 1 according to example embodiments.

Referring to FIG. 2, the memory controller 100 may include the CPU 135, a refresh management (RFM) control logic 170, a refresh logic 140, a host interface 150, a scheduler 155 and a memory interface 160 which are connected to each other through a bus 105.

The CPU 135 may control overall operation of the memory controller 100. The CPU 135 may control the RFM control logic 170, the refresh logic 140, the host interface 150, the scheduler 155 and the memory interface 160 through the bus 105.

The refresh logic 140 may generate auto refresh command for refreshing memory cells of the plurality of memory cell rows based on a refresh interval of the semiconductor memory device 200.

The host interface 150 may perform interfacing with a host. The memory interface 160 may perform interfacing with the semiconductor memory device 200.

The scheduler 155 may manage scheduling and transmission of sequences of commands generated in the memory controller 100.

The RFM control logic 170 may generate a refresh management command for a memory cell row associated with a row hammer, from among a plurality of memory cell rows of the semiconductor memory device 200 and may apply the refresh management command to the semiconductor memory device 200 through the memory interface 160 such that the semiconductor memory device 200 performs a hammer refresh operation on one or more victim memory cell rows which are physically adjacent to a memory cell row corresponding to a hammer address.

Figure 3:
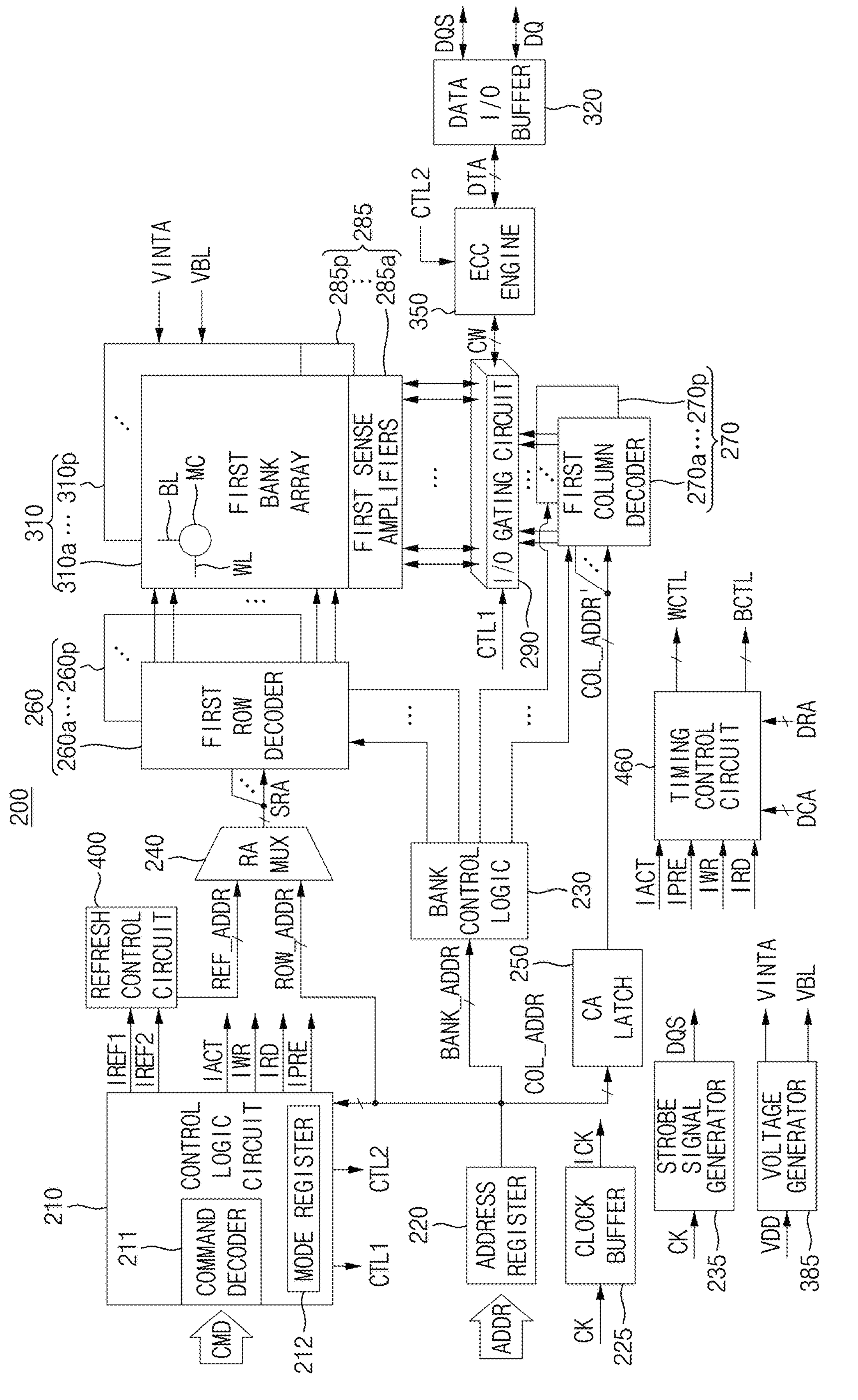
FIG. 3 is a block diagram illustrating an example of a semiconductor memory device in the memory system of FIG. 1 according to example embodiments.

FIG. 3 is a block diagram illustrating an example of the semiconductor memory device in the memory system of FIG. 1 according to example embodiments.

Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an input/output (I/O) gating circuit 290, an error correction code (ECC) engine 350, a clock buffer 225, a strobe signal generator 235, a voltage generator 385, a timing control circuit 460 and a data I/O buffer 320.

The memory cell array 310 may include first through sixteenth bank arrays 310*a*~310*p*. The row decoder 260 may include first through sixteenth row decoders 260*a*~260*p* respectively coupled to the first through sixteenth bank arrays 310*a*~310*p*, the column decoder 270 may include first through sixteenth column decoders 270*a*~270*p* respectively coupled to the first through sixteenth bank arrays 310*a*~310*p*, and the sense amplifier unit 285 may include first through sixteenth sense amplifiers 285*a*~285*p* respectively coupled to the first through sixteenth bank arrays 310*a*~310*p*.

The first through sixteenth bank arrays 310*a*~310*p*, the first through sixteenth row decoders 260*a*~260*p*, the first through sixteenth column decoders 270*a*~270*p* and the first through sixteenth sense amplifiers 285*a*~285*p* may form first through sixteenth banks. Each of the first through sixteenth bank arrays 310*a*~310*p* may include a plurality of memory cells MC formed at intersections of a plurality of word-lines WL and a plurality of bit-lines BL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260*a*~260*p* corresponding to the bank address BANK_ADDR may be activated in response to the bank control signals, and one of the first through sixteenth column decoders 270*a*~270*p* corresponding to the bank address BANK_ADDR may be activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 may be applied to the first through sixteenth row decoders 260*a*~260*p*.

The refresh control circuit 400 may sequentially increase or decrease the refresh row address REF_ADDR in a normal refresh mode in response to first and second refresh control signals IREF1 and IREF2 from the control logic circuit 210.

The activated one of the first through sixteenth row decoders 260*a*~260*p*, by the bank control logic 230, may decode the row address SRA that is output from the row address multiplexer 240, and may activate a word-line WL corresponding to the row address SRA. For example, the activated row decoder may apply a word-line driving voltage to the word-line corresponding to the row address SRA.

The column address latch 250 may receive the column address COL_ADDR from the address register 220, and may temporarily store the received column address COL_ADDR. In some example embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270*a*~270*p*.

The activated one of the first through sixteenth column decoders 270*a*~270*p* may activate a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310*a*~310*p*, and write drivers for writing data to the first through sixteenth bank arrays 310*a*~310*p*.

Codeword CW read from a selected one bank array of the first through sixteenth bank arrays 310*a*~310*p* may be sensed by a sense amplifier coupled to the selected one bank array from which the data is to be read, and may be stored in the read data latches. The codeword CW stored in the read data latches may be provided to the data I/O buffer 320 as data DTA after ECC decoding is performed on the codeword CW by the ECC engine 350. The data I/O buffer 320 may convert the data DTA into the data signal DQ and may transmit the data signal DQ along with the data strobe signal DQS to the memory controller 100.

The data signal DQ to be written in a selected one bank array of the first through sixteenth bank arrays 310*a*~310*p* may be provided to the data I/O buffer 320 from the memory controller 100. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including the data DTA and the parity bits to the I/O gating circuit 290. The I/O gating circuit 290 may write the codeword CW in a target page in the selected one bank array through the write drivers.

The data I/O buffer 320 may provide the data signal DQ from the memory controller 100 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 100 in a read operation of the semiconductor memory device 200.

The ECC engine 350 may perform an ECC encoding on the data DTA and may perform an ECC decoding on the codeword CW based on a second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the data I/O buffer 320.

The voltage generator 385 may generate an internal power supply voltage VINTA and a precharge voltage VBL based on a power supply voltage VDD received from an external device (i.e. the memory controller 100) and may provide the internal power supply voltage VINTA and the precharge voltage VBL to the memory cell array 310. For example, a voltage level of the internal power supply voltage VINTA may be less than a voltage level of the power supply voltage VDD.

The control logic circuit 210 may control operations of the semiconductor memory device 200. For example, the control logic circuit 210 may generate control signals for the semiconductor memory device 200 in order to perform a write operation, a read operation, and a refresh operation. The control logic circuit 210 may include a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit and the second control signal CTL2 to the ECC engine 350. In addition, the command decoder 211 may generate internal command signals including the first refresh control signal IREF1, the second refresh control signal IREF2, an active signal IACT, a precharge signal IPRE, a read signal IRD and a write signal IWR by decoding the command CMD.

The timing control circuit 460 may receive the active signal IACT, the precharge signal IPRE, the read signal IRD, the write signal IWR, a decoded row address DRA and a decoded column address DCA and may generate a word-line control signal WCTL for controlling word-lines WL and a bit-line control signal BCTL for controlling bit-lines BL, and may provide the word-line control signal WCTL and the bit-line control signal BCTL to the memory cell array 310. The decoded row address DRA may be generated from the row decoder 260 and the decoded column address DCA may be generated from the column decoder 270.

Figure 4:
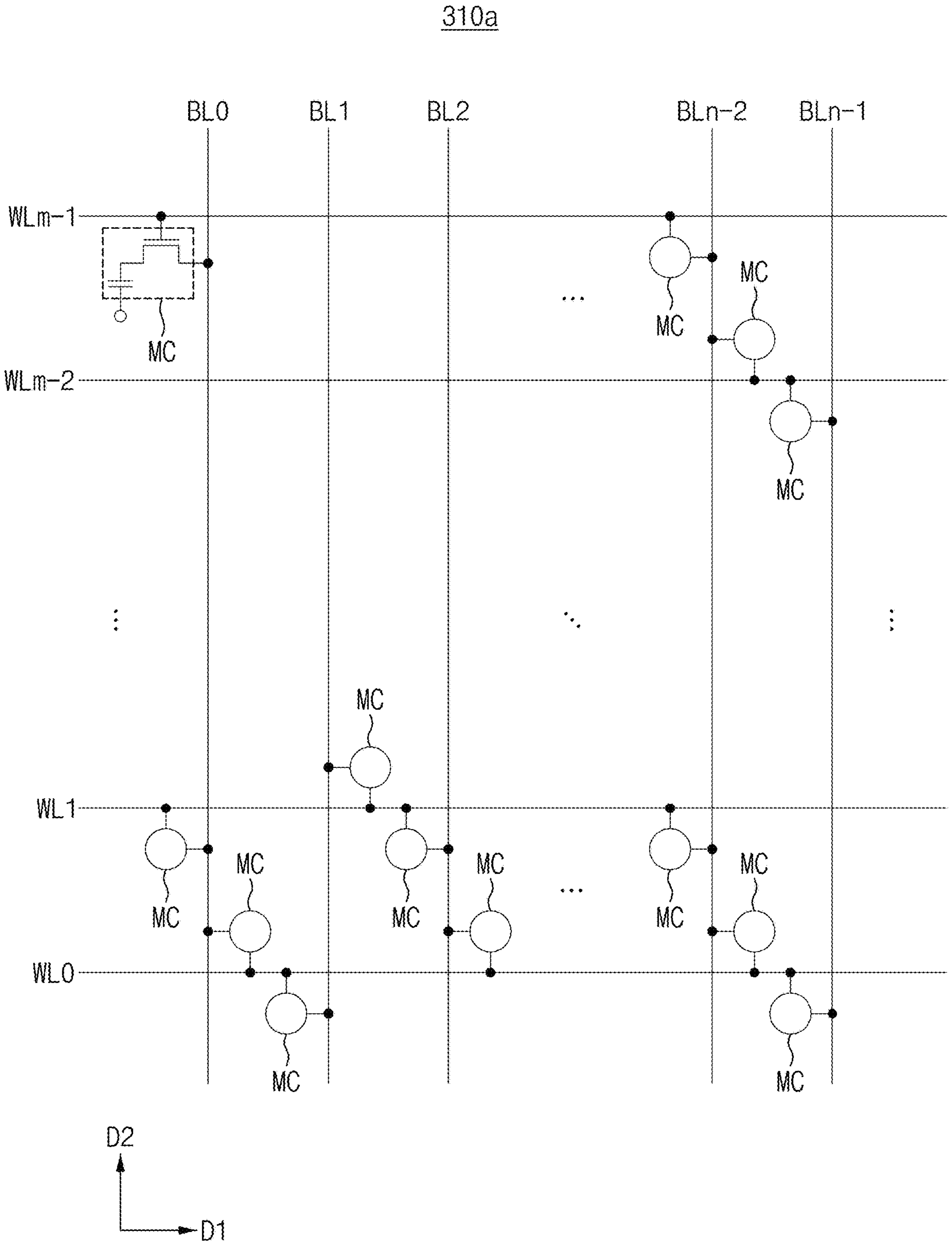
FIG. 4 illustrates an example of a first bank array in the semiconductor memory device of FIG. 3.

FIG. 4 illustrates an example of the first bank array in the semiconductor memory device of FIG. 3.

Referring to FIG. 4, the first bank array 310*a* may include a plurality of word-lines WL0~WLm−1 (where, m is a natural number greater than two), a plurality of bit-lines BL0~BLn−1 (where, n is a natural number greater than two), and a plurality of memory cells MC disposed at intersections between the word-lines WL0~WLm−1 and the bit-lines BL0~BLn−1. Each of the memory cells MCs includes a cell transistor coupled to each of the word-lines WL0~WLm−1 and each of the bit-lines BL0~BLn−1 and a cell capacitor coupled to the cell transistor. Each of the memory cells MC may have a DRAM cell structure. Each of the word-lines WL0~WLm−1 extends in a first direction D1 and each of the bit-lines BL0~BLn−1 extends in a second direction D2 crossing the first direction D1.

The word-lines WL0~WLm−1 coupled to the plurality of memory cells MC may be referred to as rows of the first bank array 310*a* and the bit-lines BL0~BLn−1 coupled to the plurality of memory cells MC may be referred to as columns of the first bank array 310*a*.

Figure 5:
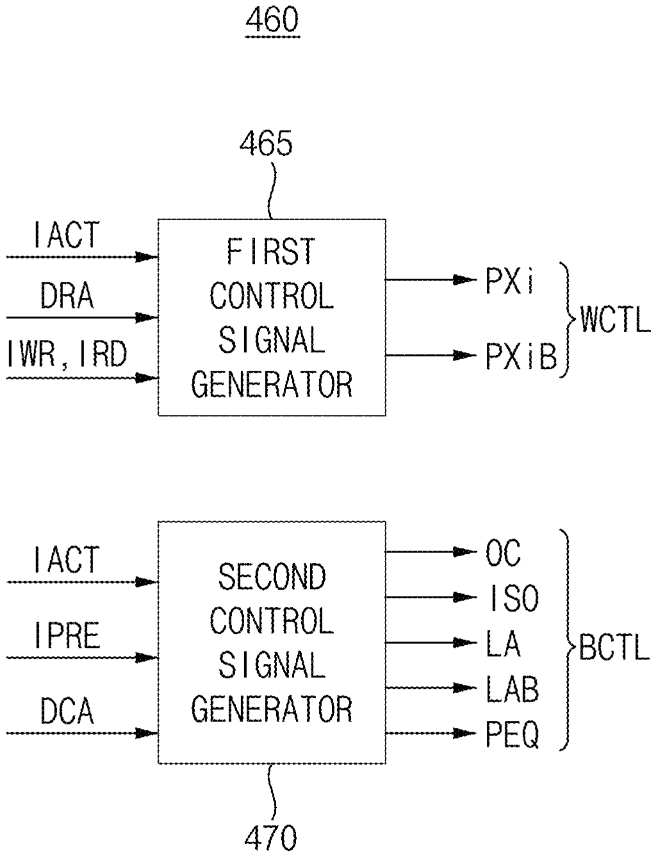
FIG. 5 is a block diagram illustrating an example of a timing control circuit in the semiconductor memory device of FIG. 3 according to example embodiments.

FIG. 5 is a block diagram illustrating an example of the timing control circuit in the semiconductor memory device of FIG. 3 according to example embodiments.

Referring to FIG. 5, the timing control circuit 460 may include a first control signal generator 465 and a second control signal generator 470.

The first control signal generator 465 may generate the word-line control signal WCTL including first and second word-line control signals PXi and PXiB to control a word-line based on the internal command signals IACT, IWR and IRD corresponding to the command CMD, and the decoded row address DRA. In addition, the first control signal generator 465 may provide the first and second word-line control signals PXi and PXiB to the memory cell array 310.

The second control signal generator 470 may generate the bit-line control signal BCTL including a first control signal LA, a second control signal LAB, an equalizing signal PEQ, an offset cancellation signal OC and an isolation signal ISO to control an operation of the bit-line sense amplifier connected to the selected memory cell, in response to the internal command signals IACT and IPRE and the decoded column address DCA, and may provide the bit-line control signal BCTL to the memory cell array 310.

Figure 6:
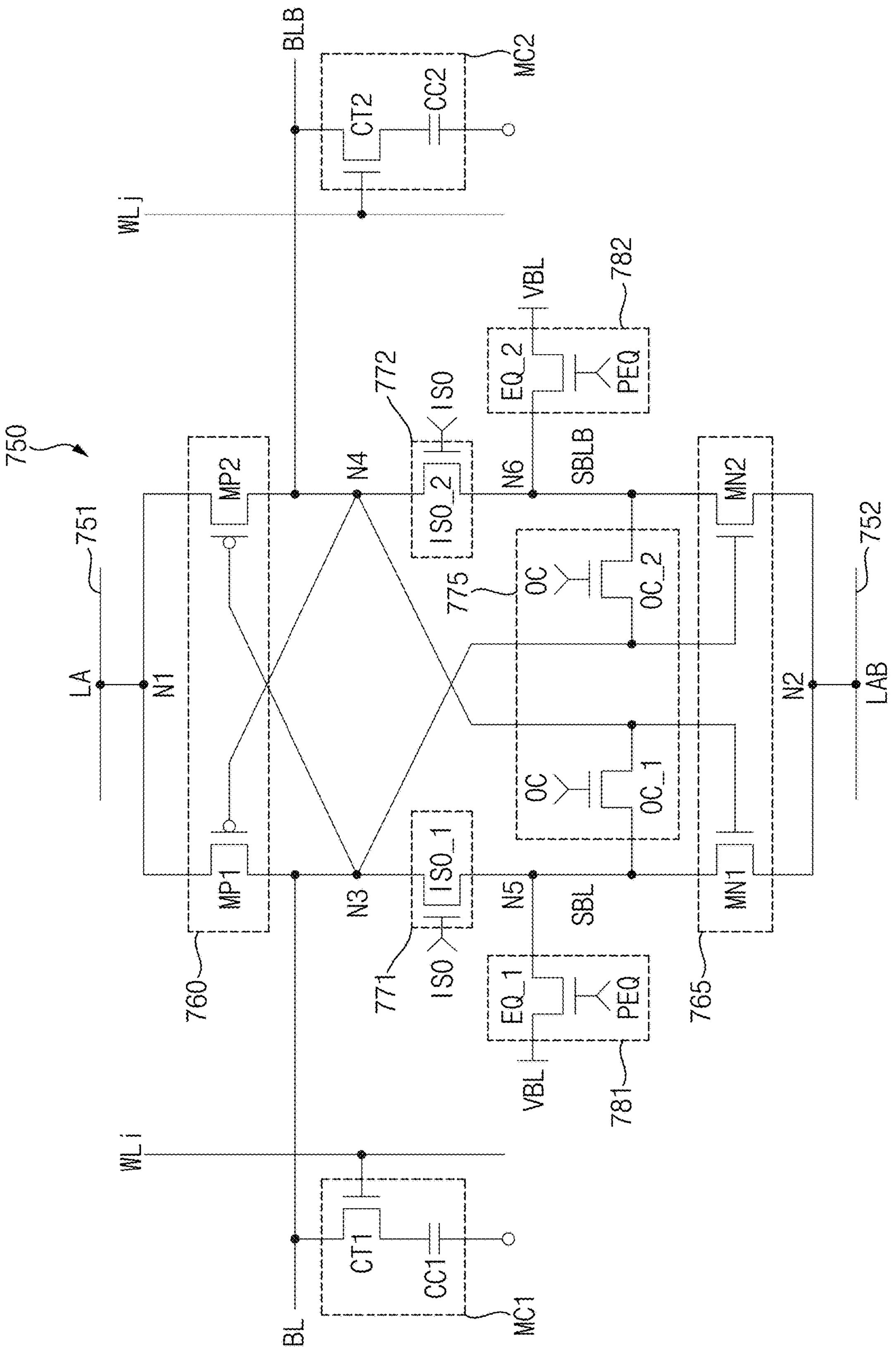
FIG. 6 is a circuit diagram illustrating an example of a bit-line sense amplifier according to example embodiments.

FIG. 6 is a circuit diagram illustrating an example of a bit-line sense amplifier according to example embodiments.

In FIG. 6, a bit-line sense amplifier 750, a first memory cell MC1 and a second memory cell MC2 are illustrated for convenience of explanation.

The bit-line sense amplifier 750, the first memory cell MC1 and the second memory cell MC2 may constitute a semiconductor memory device.

Referring to FIG. 6, the first memory cell MC1 may include a cell transistor CT1 coupled to a first word-line WLi and a bit-line BL, and a cell capacitor CC1 coupled between the cell transistor CT1 and a ground voltage or a predetermined voltage (e.g., ½ VDD) and the second memory cell MC2 may include a cell transistor CT2 coupled to a second word-line WLj and a complementary bit-line BLB, and a cell capacitor CC2 coupled between the cell transistor CT2 and the ground voltage or the predetermined voltage.

The bit-line sense amplifier 750 may include an amplifying circuit 760 and 765, an isolation circuit 771 and 772, an offset cancellation circuit 775 and an equalizer 781 and 782.

The amplifying circuit 760 and 765 may be connected to the bit-line BL and the complementary bit-line BLB, may sense a voltage difference between the bit-line BL and the complementary bit-line BLB based on the first control signal LA and the second control signal LAB, and may adjust a voltage of a sensing bit-line SBL and a complementary sensing bit-line SBLB based on the voltage difference.

The amplifying circuit 760 and 765 may include a P-type amplifier 760 and an N-type amplifier 765.

The P-type amplifier 760 may be connected to a first supply line 751 receiving the first control signal LA at a first node N1, may be connected to the bit-line BL at a third node N3 and may be connected to the complementary bit-line BLB at a fourth node N4. The N-type amplifier 765 may be connected to a second supply line 752 receiving the second control signal LAB at a second node N2, may be connected to the sensing bit-line SBL at a fifth node N5 and may be connected to the complementary sensing bit-line SBLB at a sixth node N6.

The P-type amplifier 760 may include a first p-channel metal-oxide semiconductor (PMOS) transistor MP1 and a second PMOS transistor MP2. The N-type amplifier 765 may include a first n-channel metal-oxide semiconductor (NMOS) transistor MN1 and a second NMOS transistor MN2.

The first PMOS transistor MP1 may be connected between the first supply line 751 (i.e., the first node N1) and the third node N3, and may include a gate connected to the complementary bit-line BLB at the fourth node N4. The second PMOS transistor MP2 may be connected between the first supply line 751 (i.e., the first node N1) and the fourth node N4, and may include a gate connected to the bit-line BL at the third node N3.

The first NMOS transistor MN1 may be connected between the second supply line 752 (i.e., the second node N2) and the fifth node N5, and may include a gate connected to the complementary bit-line BLB at the fourth node N4. The second NMOS transistor MN2 may be connected between the second supply line 752 (i.e., the second node N2) and the sixth node N6, and may include a gate connected to the bit-line BL at the third node N3.

The offset cancellation circuit 775 may connect the sensing bit-line SBL and the complementary sensing bit-line SBLB to the complementary bit-line BLB and the bit-line BL, respectively, based on the offset cancellation signal OC.

The offset cancellation circuit 775 may include a first offset cancellation transistor OC_1 and a second offset cancellation transistor OC_2. The first offset cancellation transistor OC_1 may be connected between the fifth node N5 and the fourth node N4, and may include a gate to receive the offset cancellation signal OC. The second offset cancellation transistor OC_2 may be connected between the sixth node N6 and the third node N3, and may include a gate to receive the offset cancellation signal OC.

The equalizer 781 and 782 may equalize the sensing bit-line SBL and the complementary sensing bit-line SBLB by providing the precharge voltage VBL to the sensing bit-line SBL and the complementary sensing bit-line SBLB, based on the equalizing signal PEQ.

The equalizer 781 and 782 may include a first equalizing transistor EQ_1 and a second equalizing transistor EQ_2. The first equalizing transistor EQ_1 may be connected between the precharge voltage VBL (i.e., a first precharge voltage node at which the precharge voltage VBL is applied) and the fifth node N5, and may include a gate to receive the equalizing signal PEQ. The second equalizing transistor EQ_2 may be connected between the precharge voltage VBL (i.e., a second precharge voltage node at which the precharge voltage VBL is applied) and the sixth node N6, and may include a gate to receive the equalizing signal PEQ. The first equalizing transistor EQ_1 may provide the precharge voltage VBL to the fifth node N5 (i.e., the sensing bit-line SBL) based on the equalizing signal PEQ. The second equalizing transistor EQ_2 may provide the precharge voltage VBL to the sixth node N6 (i.e., the complementary sensing bit-line SBLB) based on the equalizing signal PEQ.

The isolation circuit 771 and 772 may connect/disconnect the sensing bit-line SBL and the complementary sensing bit-line SBLB to/from the bit-line BL and the complementary bit-line BLB, respectively, based on the isolation signal ISO.

The isolation circuit 771 and 772 may include a first isolation transistor ISO_1 and a second isolation transistor ISO_2. The first isolation transistor ISO_1 may be connected between the fifth node N5 and the third node N3, and may include a gate to receive the isolation signal ISO. The second isolation transistor ISO_2 may be connected between the sixth node N6 and the fourth node N4, and may include a gate to receive the isolation signal ISO. The first isolation transistor ISO_1 may connect/disconnect the sensing bit-line SBL to/from the bit-line BL based on the isolation signal ISO. The second isolation transistor ISO_2 may connect/disconnect the complementary sensing bit-line SBLB to/from the complementary bit-line BLB based on the isolation signal ISO.

In example embodiment, because each of the bit-line BL and the complementary bit-line BLB is connected to a drain of respective one of the first isolation transistor ISO_1 and the second isolation transistor ISO_2, a voltage level of each of the bit-line BL and the complementary bit-line BLB may swing between a power supply voltage (e.g., VDD) and the ground voltage VSS when the isolation signal ISO, which is applied to gates of the first isolation transistor ISO_1 and the second isolation transistor ISO_2, has a voltage level of the power supply voltage.

In contrast, because each of the bit-line BL and the complementary bit-line BLB is connected to a source of respective one of isolation transistors in the conventional bit-line sense amplifier, a voltage level of each of the bit-line BL and the complementary bit-line BLB swings between a power supply voltage and the ground voltage VSS when the isolation signal, which is applied to gates of the isolation transistors, has a voltage level corresponding to summed result of the power supply voltage and a threshold voltage of each of the isolation transistors.

Therefore, the bit-line sense amplifier 750 may reduce power consumption by decreasing a voltage level of the isolation signal ISO and the N-type amplifier 765 may operate dominantly over the P-type amplifier 760 in an offset cancellation operation and a charge sharing operation because the first isolation transistor ISO_1 and the second isolation transistor ISO_2 disconnect the sensing bit-line SBL and the complementary sensing bit-line SBLB from the bit-line BL and the complementary bit-line BLB, respectively, in the offset cancellation operation and the charge sharing operation.

Figure 7:
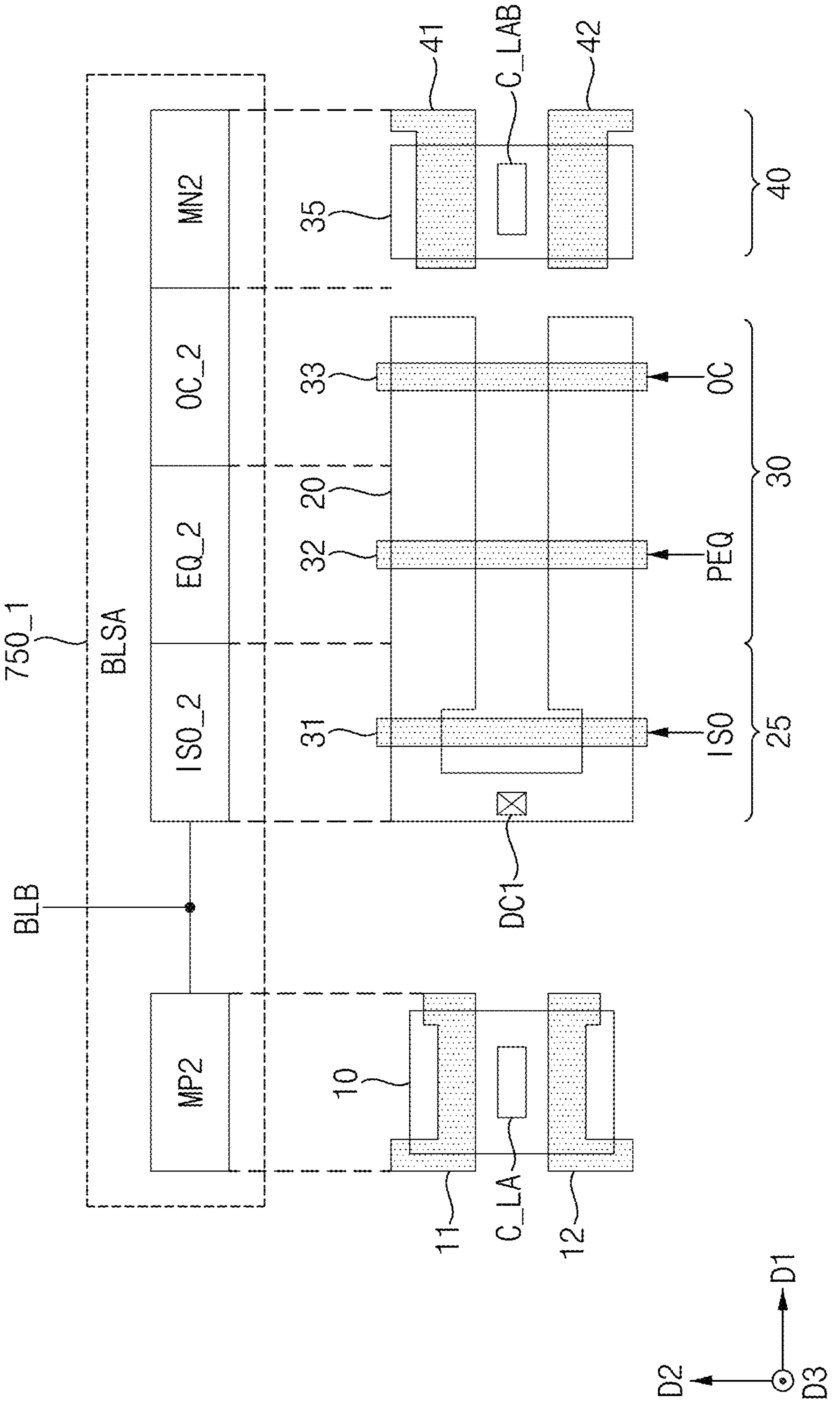
FIG. 7 is a diagram illustrating a layout of a bit-line sense amplifier in FIG. 6 according to example embodiments.

FIG. 7 is a diagram illustrating a layout of the bit-line sense amplifier in FIG. 6 according to example embodiments.

FIG. 7 is a layout illustrating a right half of the bit-line sense amplifier 750 in FIG. 6.

Referring to FIG. 7, a bit-line sense amplifier 750_1 may include a first active region 20, a second active region 35 and a third active region 10.

The third active region 10 may be placed on a substrate in a rectangular active pattern in a first direction D1 and a second direction D2 crossing the first direction D1. The first active region 20 may be spaced apart from the third active region 10 in the first direction D1 on the substrate, and may be placed in an active pattern in a fork shape. The second active region 35 may be spaced apart from a first side of the first active region 20 in the first direction D1. The third active region 10 may be spaced apart from a second side of the first active region 20 in the first direction D1.

A contact C_LA for connecting to a metal pattern transferring the first control signal LA may be formed over the third active region 10.

The first active region 20 may include a first region 25 having a horseshoe-shaped portion extending in the first direction D1 on the substrate and a second region 30 having rectangular portions extending in the first direction D1 and spaced apart from each other in the second direction D2. For example, the first region 25 may include a horseshoe-shaped portion of the first active region 20 (e.g., in a plan view) of the first active region 20, and the second region 30 may include rectangular portions of the first active region 20 that are spaced apart from each other (e.g., in the second direction D2). The second region 30 may be adjacent to the first region 25. The first active region 20 may extend in the first direction D1. The horseshoe-shaped portion of the first active region 20 in the first region 25 and the rectangular portions of the first active region 20 in the second region 30 may be connected.

In example embodiments, the rectangular portions of the second region 30 may be a pair of active patterns extending parallel to each other in the first direction D1. According to some embodiments, each of the pair of active patterns may have a rectangular shape, however, the one or more embodiments are not limited thereto, and may include other shapes such as square, circular, oval, trapezoidal, and others.

The second active region 35 may be spaced apart from the first side of the first active region 20 in the first direction D1 and may include a third region 40. The third region 40 may have a rectangular shape. A contact C_LAB for connecting to a metal pattern transferring the second control signal LAB may be formed above or under the third region 40.

The bit-line sense amplifier 750_1 may further include a first gate pattern 31, a second gate pattern 32, a third gate pattern 33, fourth gate patterns 41 and 42, and fifth gate patterns 11 and 12.

The first gate pattern 31 may extend in the second direction D2 on the first region 25 and may receive the isolation signal ISO. The first gate pattern 31 and the first region 25 may correspond to (i.e., may constitute) the second isolation transistor ISO_2.

The second gate pattern 32 and the third gate pattern 33 may be spaced apart from each other in the first direction D1 and may extend in the second direction D2 in parallel on the second region 30. The second gate pattern 32 may receive the equalizing signal PEQ and the third gate pattern 33 may receive the offset cancellation signal OC. The second gate pattern 32 and the second region 30 may correspond to (i.e., may constitute) the second equalizing transistor EQ_2. The third gate pattern 33 and the second region 30 may correspond to (i.e., may constitute) the second offset cancellation transistor OC_2.

In example embodiments, the second gate pattern 32 may receive the offset cancellation signal OC and the third gate pattern 33 may receive the equalizing signal PEQ. In this case, the second gate pattern 32 and the second region 30 may correspond to (i.e., may constitute) the second offset cancellation transistor OC_2, and the third gate pattern 33 and the second region 30 may correspond to (i.e., may constitute) the second equalizing transistor EQ_2.

The fourth gate patterns 41 and 42 may be spaced apart from each other in the second direction D2 and may be provided as a rectangular shape on the third region 40.

The fourth gate pattern 41 and the second active region 35 may correspond to (i.e., may constitute) the second NMOS transistor MN2 and the fourth gate pattern 42 and the second active region 35 may correspond to (i.e., may constitute) a second NMOS transistor of another bit-line sense amplifier.

A direct contact DC1 may be provided over the first region 25 and the complementary bit-line BLB may be connected to the drain of the second isolation transistor ISO_2 through the direct contact DC1.

As described with reference to FIG. 6, because the complementary bit-line BLB is connected to the drain of the second isolation transistor ISO_2, a voltage level of the complementary bit-line BLB may swing between a power supply voltage VDD and the ground voltage VSS when the isolation signal ISO, which is applied to the gate of the second isolation transistor ISO_2, has a voltage level of the power supply voltage. In some embodiments, the voltage level of the complementary bit-line BLB may swing between the internal power supply voltage VINTA and the ground voltage VSS when the isolation signal ISO has the voltage level of the internal power supply voltage VINTA.

The fifth gate patterns 11 and 12 may be spaced apart from each other in the second direction D2 and may be provided as a rectangular shape on the third active region 10.

The fifth gate pattern 11 and the third active region 10 may correspond to (i.e., may constitute) the second PMOS transistor MP2 and the fifth gate pattern 12 and the third active region 10 may correspond to (i.e., may constitute) a second PMOS transistor of another bit-line sense amplifier.

The first active region 20 and the second active region 35 may correspond to an N-type active region and the third active region 10 may be a P-type active region.

Figure 8:
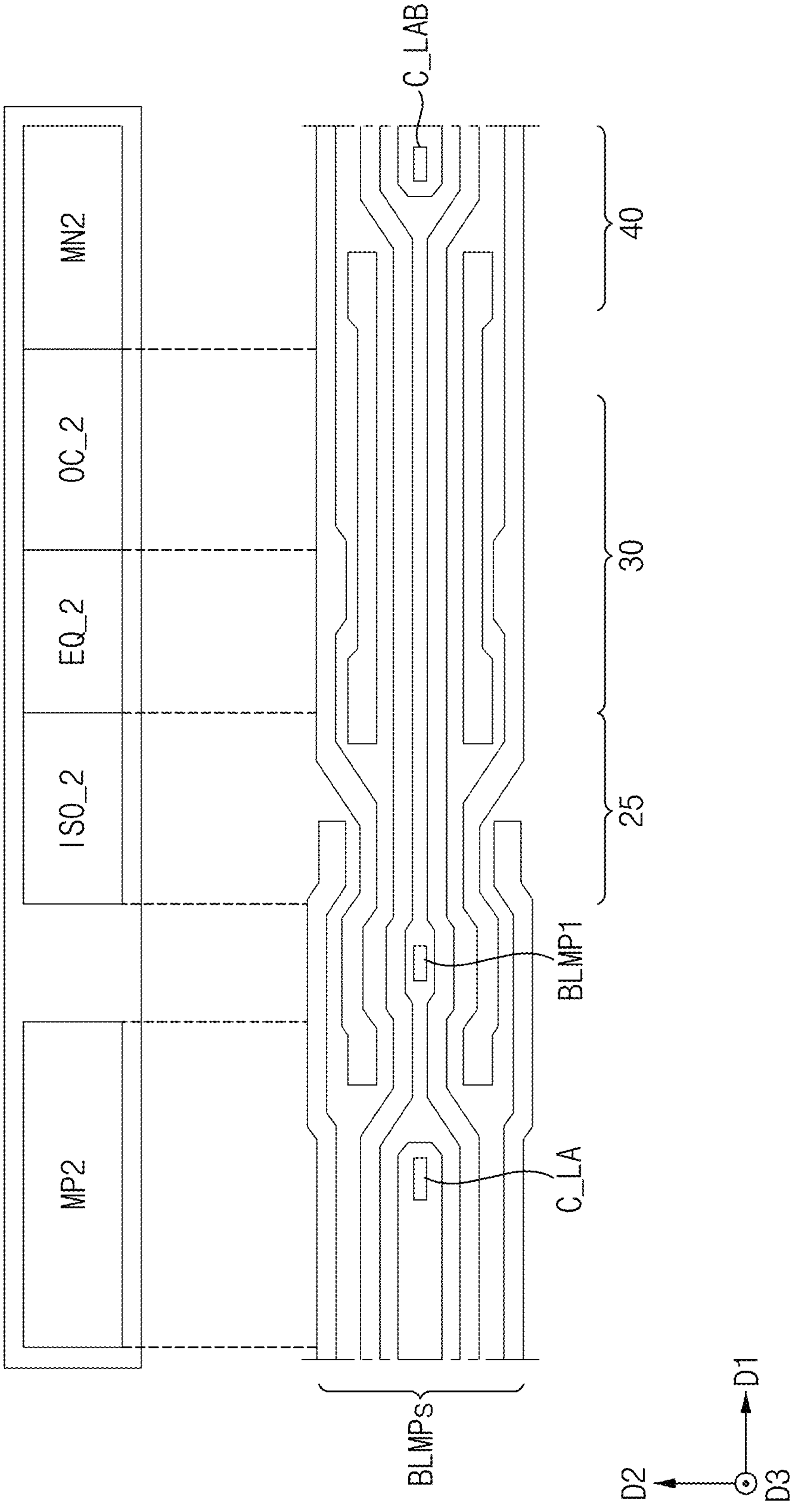
FIG. 8 illustrates an example of a bit-line layout connected to the bit-line sense amplifier in FIG. 7 according to example embodiments.

FIG. 8 illustrates an example of a bit-line layout connected to the bit-line sense amplifier in FIG. 7 according to example embodiments.

Referring to FIG. 8, bit-line metal patterns BLMPs including a bit-line metal pattern BLMP1 may be formed on the layout of the bit-line sense amplifier 750_1 and may be connected to the bit-line sense amplifier 750_1 in FIG. 7. The contact C_LA for connecting to a metal pattern transferring the first control signal LA and the contact C_LAB for connecting to a metal pattern transferring the second control signal LAB may be formed among the bit-line metal patterns BLMPs. The bit-line metal pattern BLMP1 may be formed on the direct contact DC1.

Figure 9:
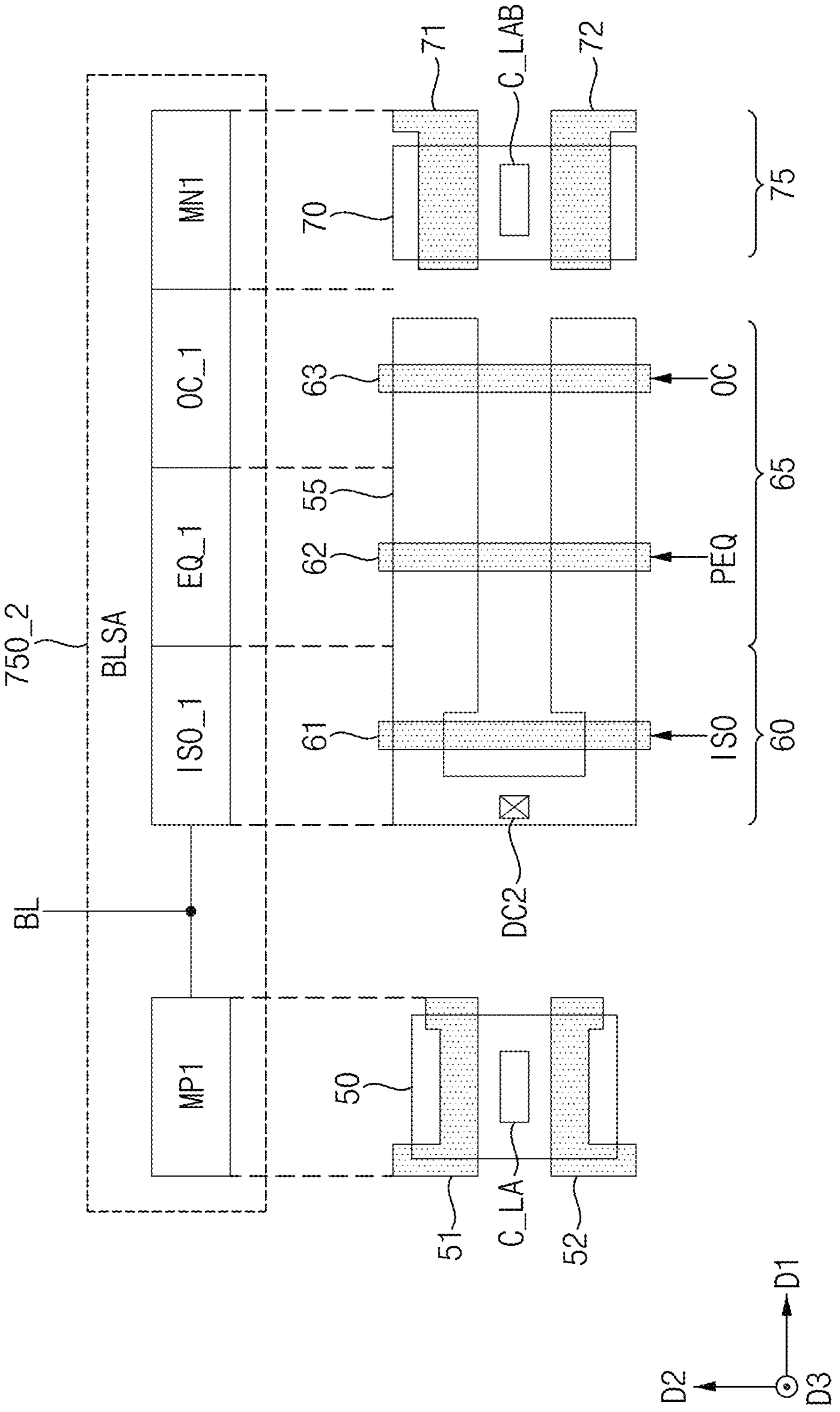
FIG. 9 is a circuit diagram illustrating an example of a bit-line sense amplifier according to example embodiments.

FIG. 9 is a circuit diagram illustrating an example of a bit-line sense amplifier according to example embodiments.

FIG. 9 is a layout illustrating a left half of the bit-line sense amplifier 750 in FIG. 6.

Referring to FIG. 9, a bit-line sense amplifier 750_2 may include a first active region 55, a second active region 70 and a third active region 50.

The third active region 50 may be placed on a substrate in a rectangular active pattern in the first direction D1 and the second direction D2. The first active region 55 may be spaced apart from the third active region 50 in the first direction D1 on the substrate, and may be placed in an active pattern in a fork shape. The second active region 70 may be spaced apart from a first side of the first active region 55 in the first direction D1. The third active region 50 may be spaced apart from a second side of the first active region 55 in the first direction D1.

A contact C_LA for connecting to a metal pattern transferring the first control signal LA may be formed over the third active region 50.

The first active region 55 may include a first region 60 having a horseshoe-shaped portion extending in the first direction D1 on the substrate and a second region 65 having rectangular portions extending in the first direction and spaced apart from each other in the second direction D2. For example, the first region 60 may include a horseshoe-shaped portion (e.g., in a plan view) of the first active region 55, and the second region 65 may include rectangular portions of the first active region 55 that are spaced apart from each other (e.g., in the second direction D2). The second region 65 may be adjacent to the first region 60. The first active region 55 may extend in the first direction D1, and the horse-shoe shaped portion of the first active region 55 in the first region 60 and the rectangular portions of the first active region 55 in the second region 65 may be connected.

In example embodiments, the rectangular portions of the second region 65 may be a pair of active patterns extending parallel to each other in the first direction D1. Each of the pair of active patterns may have a rectangular shape, however, the one or more embodiments are not limited thereto, and may include other shapes such as square, circular, oval, trapezoidal, and others.

The second active region 70 may be spaced apart from a first side of the first active region 55 in the first direction D1 and may include a third region 75. The third region 75 may have a rectangular shape. A contact C_LAB for connecting to a metal pattern transferring the second control signal LAB may be formed over the third region 75.

The bit-line sense amplifier 750_2 may further include a first gate pattern 61, a second gate pattern 62, a third gate pattern 63, fourth gate patterns 71 and 72, and fifth gate patterns 51 and 52.

The first gate pattern 61 may extend in the second direction D2 on the first region 60 and may receive the equalizing signal PEQ. The first gate pattern 61 and the first region 60 may correspond to (i.e., may constitute) the first isolation transistor ISO_1.

The second gate pattern 62 and the third gate pattern 63 may be spaced apart from each other in the first direction D1 and may extend in the second direction D2 in parallel on the second region 65. The second gate pattern 62 may receive the second equalizing transistor EQ_2 and the third gate pattern 63 may receive the offset cancellation signal OC. The second gate pattern 62 and the second region 65 may correspond to (i.e., may constitute) the first equalizing transistor EQ_1. The third gate pattern 63 and the second region 65 may correspond to (i.e., may constitute) the first offset cancellation transistor OC_1.

In example embodiments, the second gate pattern 62 may receive the offset cancellation signal OC and the third gate pattern 63 may receive the equalizing signal PEQ. In this case, the second gate pattern 62 and the second region 65 may correspond to (i.e., may constitute) the first offset cancellation transistor OC_2, and the third gate pattern 63 and the second region 60 may correspond to (i.e., may constitute) the first equalizing transistor EQ_1.

The fourth gate patterns 71 and 72 may be spaced apart from each other in the second direction D2 and may be provided as a rectangular shape on the third region 70.

The fourth gate pattern 71 and the second active region 70 may correspond to (i.e., may constitute) the first NMOS transistor MN1 and the fourth gate pattern 72 and the second active region 70 may correspond to (i.e., may constitute) a first NMOS transistor of another bit-line sense amplifier.

A direct contact DC2 may be provided over the first region 60 and the bit-line BL may be connected to the drain of the first isolation transistor ISO_1 through the direct contact DC2.

The fifth gate patterns 51 and 52 may be spaced apart from each other in the second direction D2 and may be provided as a rectangular shape on the third active region 50.

The fifth gate pattern 51 and the third active region 50 may correspond to (i.e., may constitute) the first PMOS transistor MP1 and the fifth gate pattern 52 and the third active region 50 may correspond to (i.e., may constitute) a first PMOS transistor of another bit-line sense amplifier.

The first active region 55 and the second active region 70 may correspond to an N-type active region and the third active region 50 may be a P-type active region.

As described with reference to FIG. 6, because the bit-line BL is connected to the drain of the first isolation transistor ISO_1, a voltage level of the bit-line BL may swing between the power supply voltage VDD and the ground voltage VSS when the isolation signal ISO, which is applied to the gate of the first isolation transistor ISO_1, has a voltage level of the power supply voltage. In some embodiments, the voltage level of the bit-line BL may swing between the internal power supply voltage VINTA and the ground voltage VSS when the isolation signal ISO has the voltage level of the internal power supply voltage VINTA.

Figure 10:
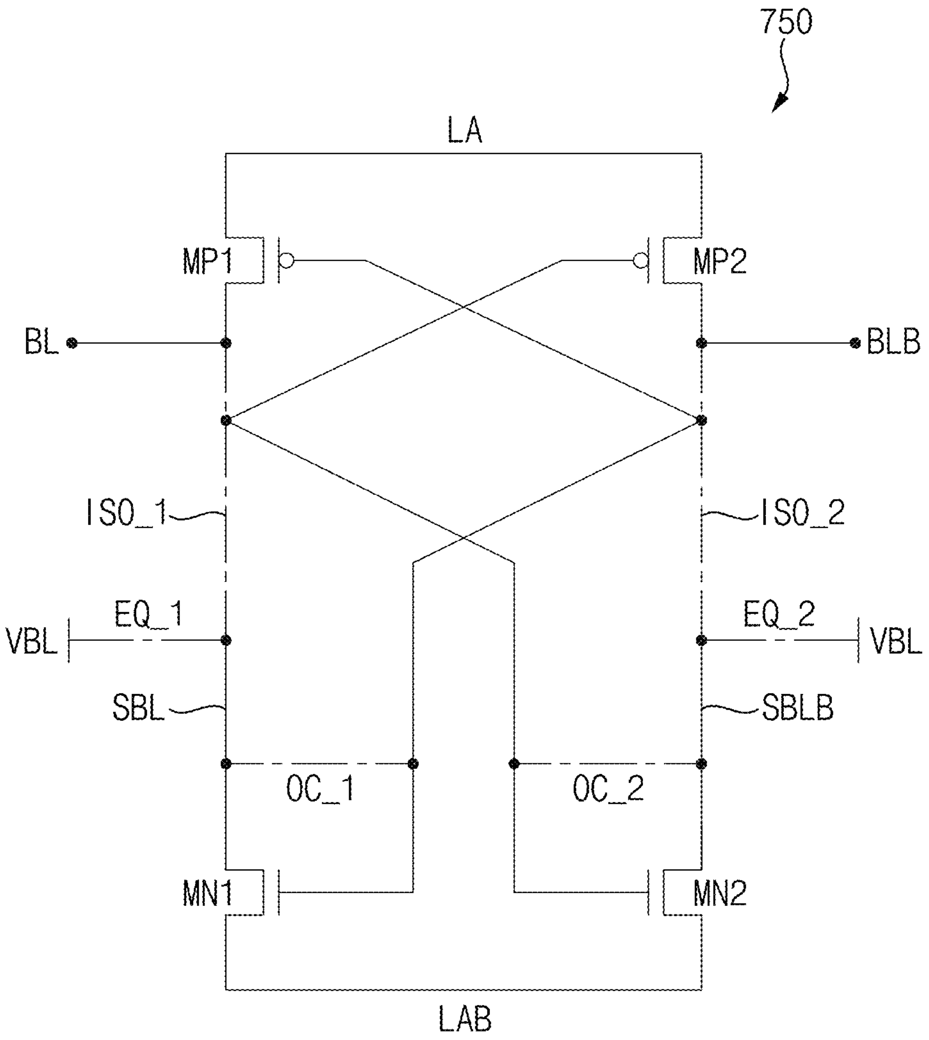
FIG. 10 shows an equivalent circuit of the bit-line sense amplifier in FIG. 6 according to example embodiments.
Figure 11:
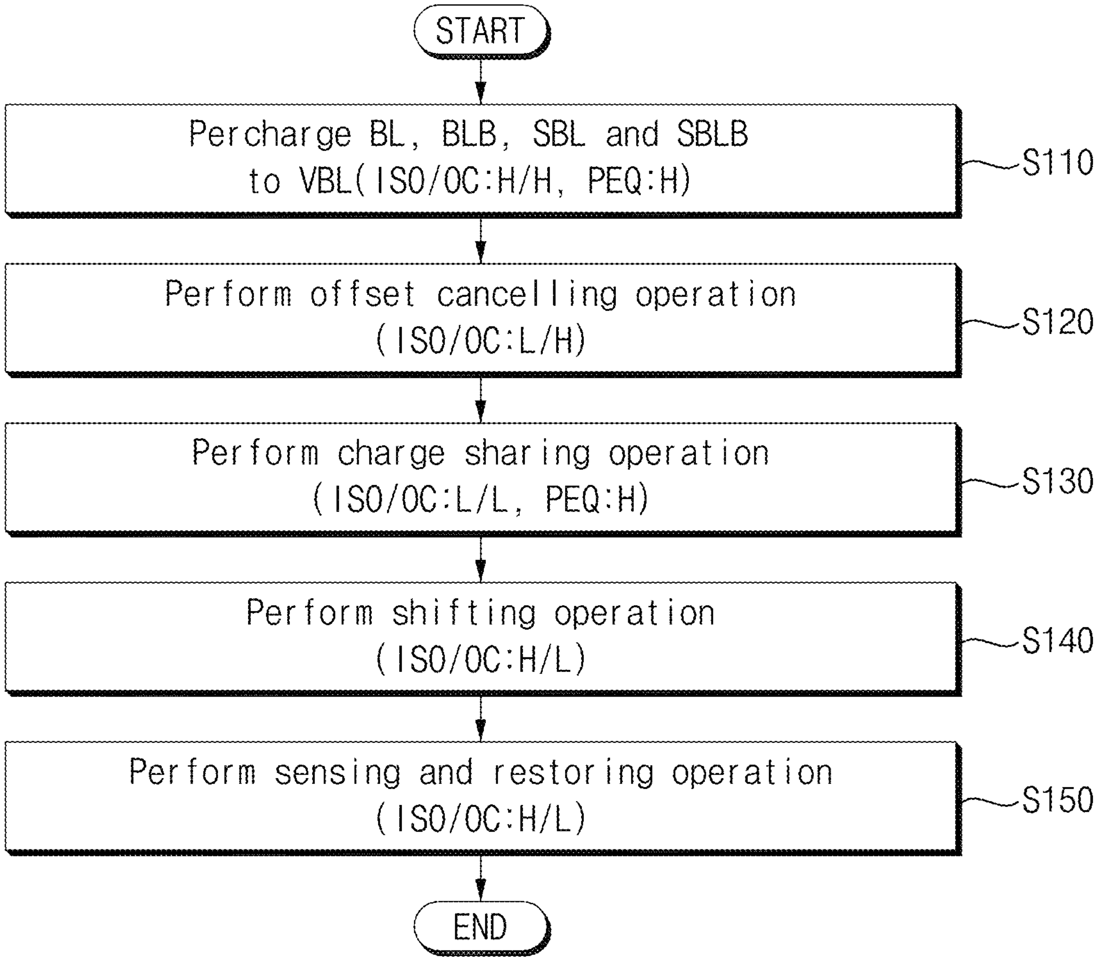
FIG. 11 is a flowchart for describing operations of the bit-line sense amplifier in FIG. 10 according to example embodiments.

FIG. 10 shows an equivalent circuit of the bit-line sense amplifier in FIG. 6 according to example embodiments. FIG. 11 is a flowchart for describing operations of the bit-line sense amplifier in FIG. 10 according to example embodiments. FIGS. 12A, 12B, 12C, 12D, and 12E are circuit diagrams for describing operations of the bit-line sense amplifier in FIG. 10 according to example embodiments.

In FIG. 10, for simplicity of the drawings, the first and second equalizing transistors EQ_1 and EQ_2, the first and second isolation transistors ISO_1 and ISO_2 and the first and second offset cancellation transistors OC_1 and OC_2 are illustrated using dashed lines. Operations of the equivalent circuit of the bit-line sense amplifier 750 illustrated in FIG. 10 will be described in detail with reference to FIGS. 11 and 12A through 12E.

Referring to FIG. 11, the bit-line sense amplifier 750 may sequentially perform a pre-charging operation (S110), an offset cancelling operation (S120), a charge sharing operation (S130), a shifting operation (S140) and sensing and restoring operation (S150) in response to the isolation signal ISO, the offset cancellation signals OC, and the first and second control signals LA and LAB. For convenience of description, the operations of FIG. 11 will be described with reference to FIGS. 12A through 12E.

Figure 12A:
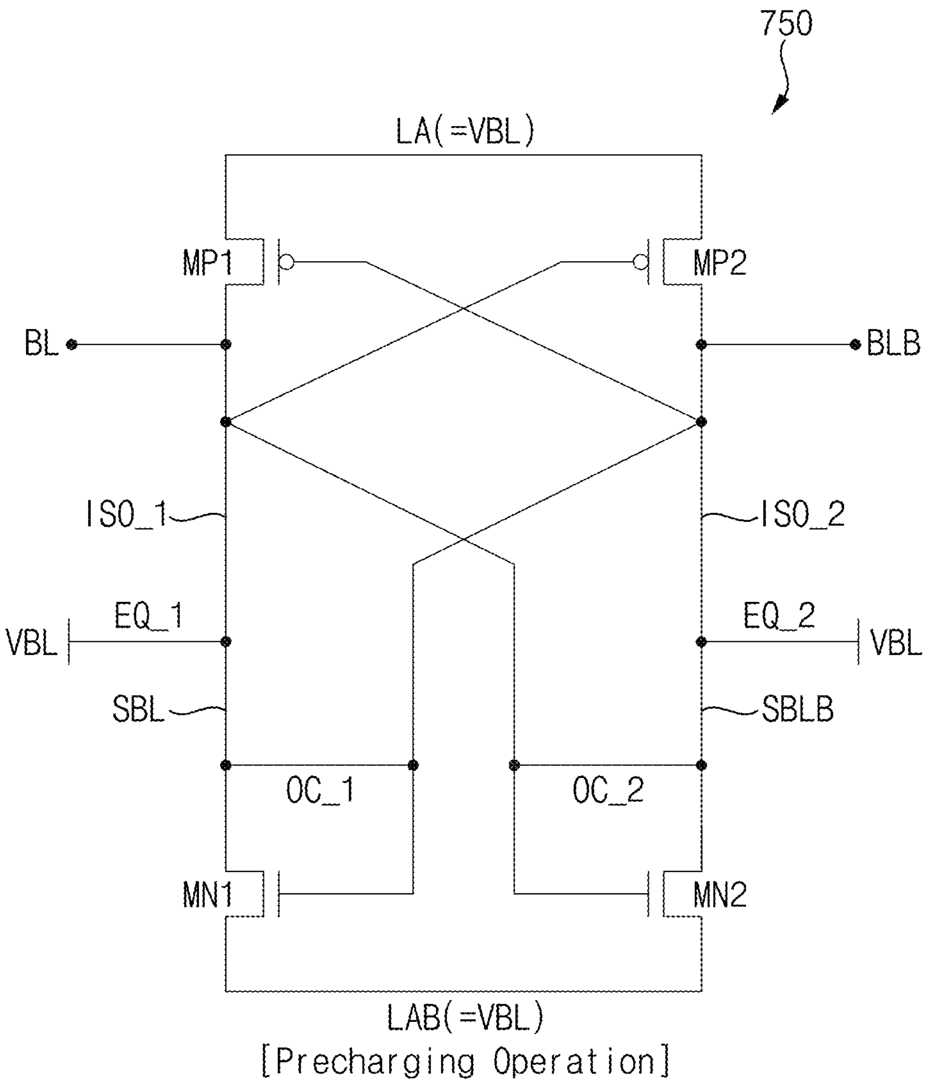
FIGS. 12A, 12B, 12C, 12D, and 12E are circuit diagrams for describing operations of the bit-line sense amplifier in FIG. 10 according to example embodiments.

Referring to FIG. 12A, in operation S110 of FIG. 11, the bit-line sense amplifier 750 performs a pre-charging operation. The bit-line sense amplifier 750 precharges the bit-line BL, the complementary bit-line BLB, the sensing bit-line SBL, and the complementary sensing bit-line SBLB to a precharge voltage VBL. For example, the equalizing signal PEQ, the isolation signal ISO and the offset cancellation signal OC may be logic high (H).

In response to the equalizing signal PEQ having a logic high level, the precharge voltage VBL is provided to the sensing bit-line SBL and the complementary sensing bit-lien SBLB, the first and second isolation transistors ISO_1 and ISO_2 are turned on in response to the isolation signal ISO having a logic high level and the first and second offset cancellation transistors OC_1 and OC_2 are turned on in response to the offset cancellation signal OC having a logic high level. Accordingly, the sensing bit-line SBL is connected to the bit-line BL and the complementary sensing bit-line SBLB is connected to the complementary bit-line BLB. Therefore, the bit-line BL, the complementary bit-line BLB, the sensing bit-line SBL and the complementary sensing bit-line SBLB may be connected to one node and charged to the precharge voltage VBL. In this case, the first and second control signals LA and LAB may be charged to the precharge voltage VBL. For example, the first control signal LA may be charged to the precharge voltage VBL by a pull-up driving circuit and the second control signal LAB may be charged to the precharge voltage VBL by a pull-down driving circuit.

Figure 12B:
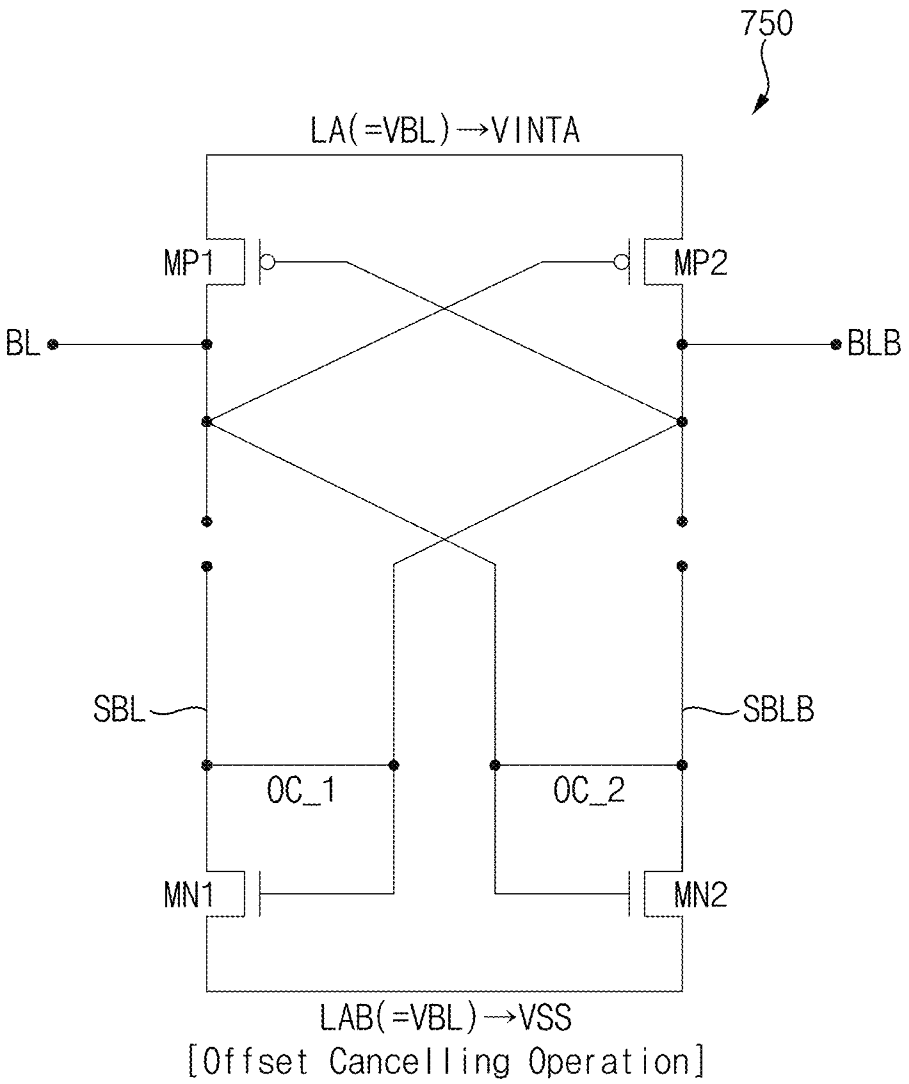

Referring to FIG. 12B, in operation S120 of FIG. 11, the bit-line sense amplifier 750 performs an offset cancelling operation. For example, the isolation signal ISO and the equalizing signal PEQ may be logic low (L) and the offset cancellation signals OC may be logic high (H).

The first and second isolation transistors ISO_1 and ISO_2 are turned off in response to the isolation signal ISO having a logic low level, and thus, the sensing bit-line SBL and the complementary sensing bit-line SBLB are disconnected from the bit-line BL and the complementary bit-line BLB, respectively. The first and second offset cancellation transistors OC_1 and OC_2 are turned on in response to the offset cancellation signal OC having a logic high level, and thus, the sensing bit-line SBL and the complementary sensing bit-line SBLB are connected to the complementary bit-line BLB and the bit-line BL, respectively. In this case, the first control signal LA is transitioned from the precharge voltage VBL to an internal power supply voltage VINTA and the second control signal LAB is transitioned from the precharge voltage VBL to the ground voltage VSS. The internal power supply voltage VINTA may be a voltage supplied to memory cell array 310 (see FIG. 3).

In the bit-line sense amplifier 750, the first and second PMOS transistors MP1 and MP2 may have different threshold voltages Vth from each other and the first and second NMOS transistors MN1 and MN2 may have different threshold voltages Vth from each other, due to a variation in manufacturing processes, temperature, or the like. In this case, the bit-line sense amplifier 750 may cause offset noise due to the difference between the threshold voltages Vth of the first and second PMOS transistors MP1 and MP2 and the first and second NMOS transistors MN1 and MN2. Hereinafter, a method of compensating an offset of the bit-line sense amplifier 750 through an offset cancelling operation will be described with reference to first to fourth examples.

Figure 13:
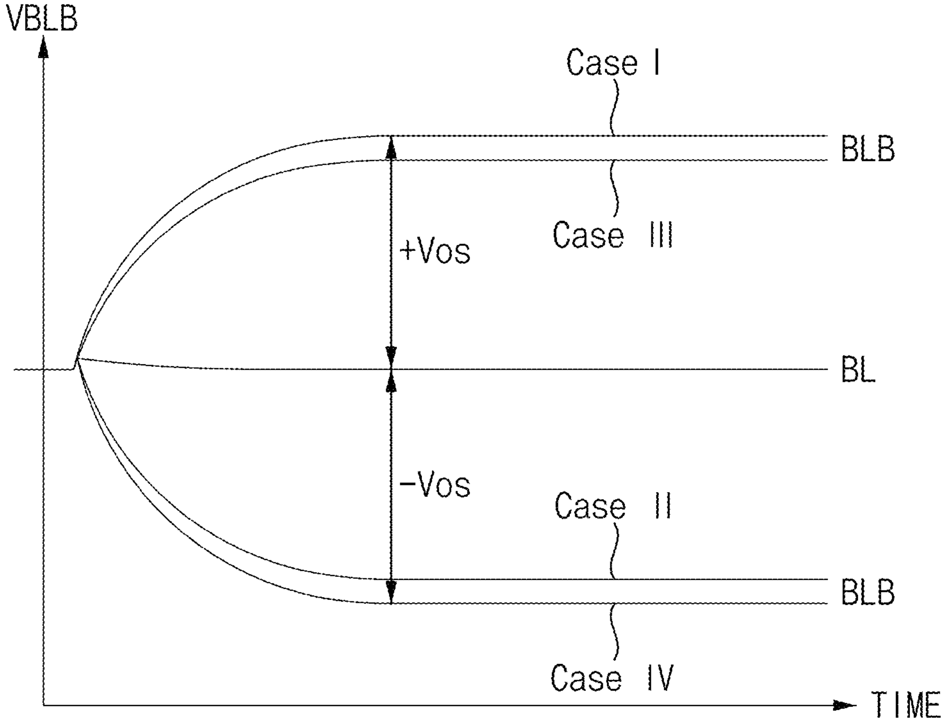
FIG. 13 is a graph for describing operations of the bit-line sense amplifier in FIG. 10 according to example embodiments.

FIG. 13 is a graph for describing operations of the bit-line sense amplifier 750 in FIG. 10 according to example embodiments.

In a first example (Case I), it is assumed that a threshold voltage of the first NMOS transistor MN1 is greater than a threshold voltage of the second NMOS transistor MN2. The first and second NMOS transistors MN1 and MN2 operate as diodes. An amount of current which flows through the first NMOS transistor MN1 may be less than an amount of current which flows through the second NMOS transistor MN2. Also, an amount of current which flows through the first PMOS transistor MP1 may be less than an amount of current which flows through the second PMOS transistor MP2. Accordingly, as illustrated in FIG. 13, the voltage on the complementary bit-line BLB may be increased to a predetermined level which is greater than the voltage on the bit-line BL.

In a second example (Case II), it is assumed that the threshold voltage of the second NMOS transistor MN2 is greater than the threshold voltage of the first NMOS transistor MN1. The first and second NMOS transistors MN1 and MN2 operate as diodes. An amount of current which flows through the second NMOS transistor MN2 may be less than an amount of current which flows through the first NMOS transistor MN1. Also, an amount of current which flows through the second PMOS transistor MP2 may be less than an amount of current which flows through the first PMOS transistor MP1. Accordingly, as illustrated in FIG. 13, the voltage on the complementary bit-line BLB may be reduced to a predetermined level which is less than the voltage on the bit-line BL.

In a third example (Case III), it is assumed that the threshold voltage of the first PMOS transistor MP1 is greater than the threshold voltage of the second PMOS transistor MP2. An amount of current which flows through the first PMOS transistor MP1 may be less than an amount of current which flows through the second PMOS transistor MP2. The first and second NMOS transistors MN1 and MN2 may flow a predetermined amount of current as diodes. Accordingly, as illustrated in FIG. 13, the voltage on the complementary bit-line BLB may be increased to a predetermined level which is greater than the voltage on the bit-line BL.

In a fourth example (Case IV), it is assumed that the threshold voltage of the second PMOS transistor MP2 is greater than the threshold voltage of the first PMOS transistor MP1. An amount of current which flows through the second PMOS transistor MP2 may be less than an amount of current which flows through the first PMOS transistor MP1. The first and second NMOS transistors MN1 and MN2 may flow a predetermined amount of current as diodes. Accordingly, as illustrated in FIG. 13, the voltage on the complementary bit-line BLB may be reduced to a predetermined level which is less than the voltage on the bit-line BL.

In the above-described first to fourth examples (Cases I to IV), the complementary bit-line BLB is increased or decreased to the predetermined level as compared to the bit-line BL, and thus the bit-line BL and the complementary bit-line BLB have a predetermined voltage difference. Such a voltage difference may be interpreted as an offset voltage due to the offset noise. This means that the offset noise of the bit-line sense amplifier 750 may be cancelled by causing the bit-line BL and the complementary bit-line BLB to have a difference by the offset voltage. That is, the bit-line sense amplifier 750 may compensate for the offset through the offset cancelling operation.

Figure 12C:
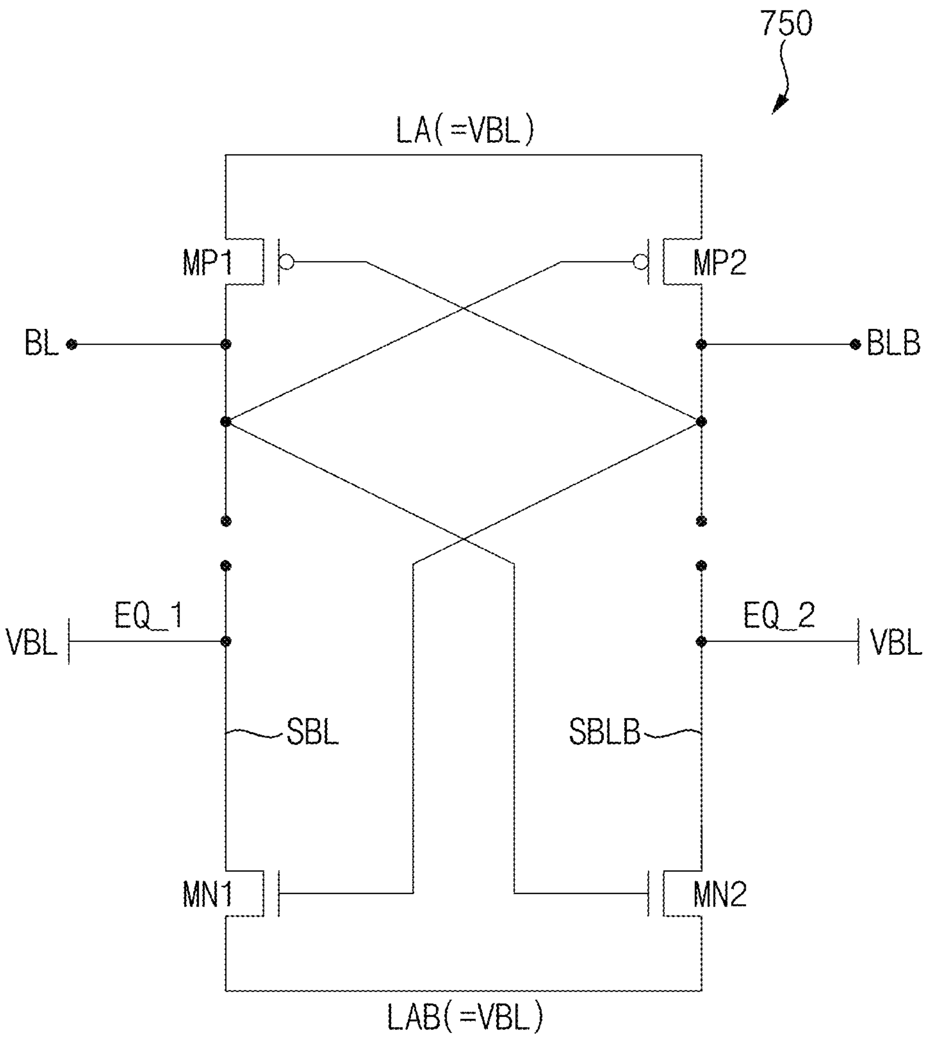

Referring to FIG. 12C, in operation S130 of FIG. 11, the bit-line sense amplifier 750 performs a charge sharing operation. For example, the isolation signal ISO and the offset cancellation signal OC may be logic low (L) and the equalizing signal PEQ may be logic high. For example, the sensing bit-line SBL and the complementary sensing bit-line SBLB may be charged to the precharge voltage VBL based on the equalizing signal PEQ having a logic high level.

The first and second isolation transistors ISO_1 and ISO_2 and the first and second offset cancellation transistors OC_1 and OC_2 are turned off in response to the isolation signal ISO and the offset cancellation signal OC having a logic low level. The sensing bit-line SBL and the complementary sensing bit-line SBLB are disconnected from the bit-line BL, the complementary bit-line BLB, based on the offset cancellation signal OC having a logic low level.

In this case, the first word-line WLi connected to the memory cell MC1 (see FIG. 6) is activated, and the charge sharing operation is performed between electric charges stored in the cell capacitor CC1 of the memory cell MC1 and electric charges stored in the bit-line BL.

For example, when data having a value of '1' is stored in the memory cell MC1, a voltage level of the bit-line BL may be increased by a predetermined amount during the charge sharing operation. On the other hand, when data having a value of '0' is stored in the memory cell MC1, the voltage level of the bit-line BL may be decreased by a predetermined amount during the charge sharing operation.

Figure 12D:
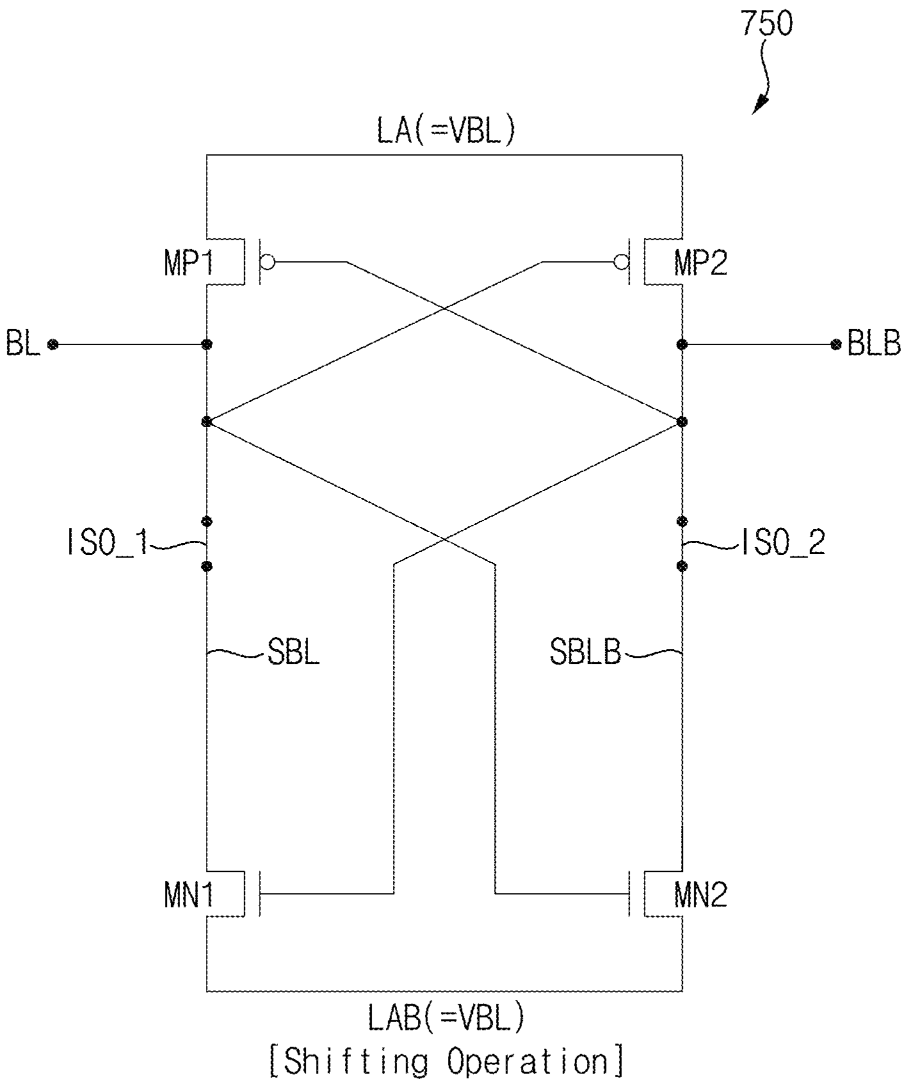

Referring to FIG. 12D, in operation S140 of FIG. 11, the bit-line sense amplifier 750 performs a shifting operation. For example, the isolation signal ISO may be logic high (H) and the offset cancellation signal OC may be logic low (L)

The sensing bit-line SBL and the complementary sensing bit-line SBLB are connected to the bit-line BL and the complementary bit-line BLB, respectively, based on the isolation signal ISO having a logic high level, and voltage levels of the bit-line BL and the complementary bit-line BLB are increased by the precharge voltage VBL of the sensing bit-line SBL and the complementary sensing bit-line SBLB. In this case, the first control signal LA and the second control signal may be maintained at the precharge voltage VBL.

Figure 12E:
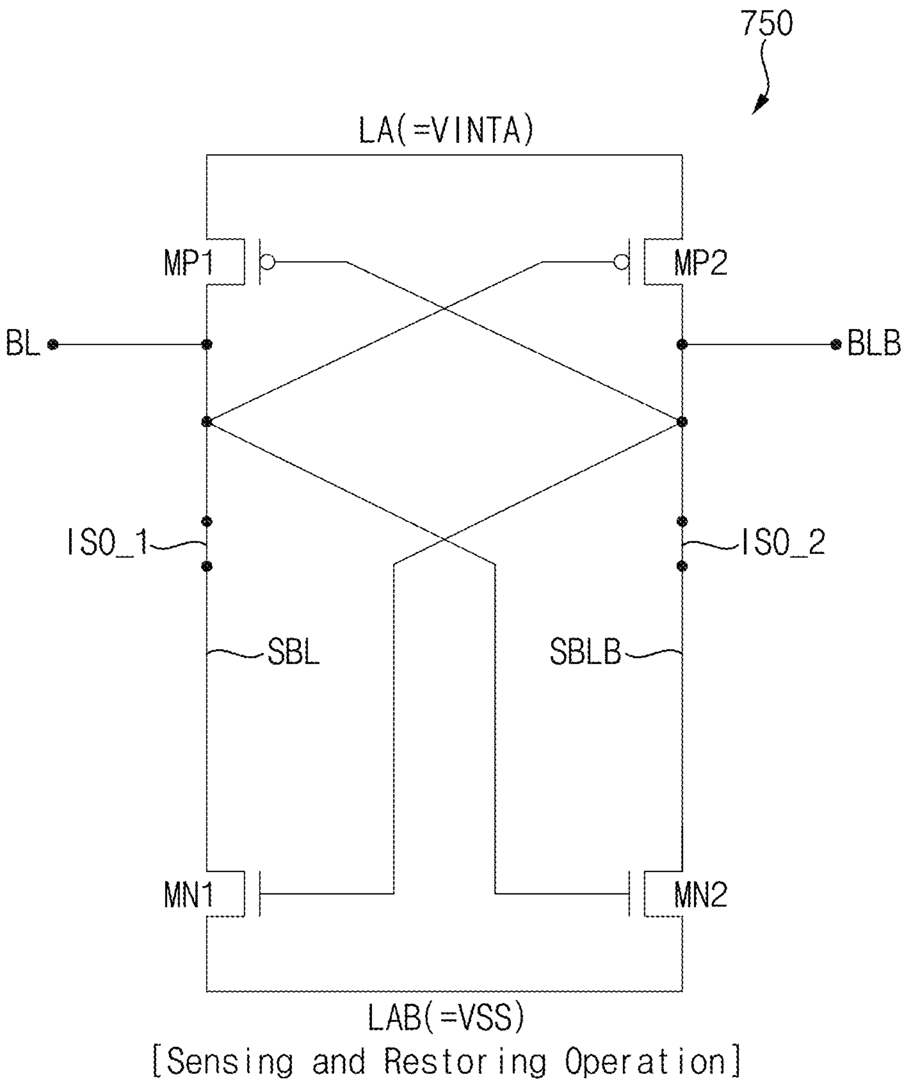

Referring to FIG. 12E, in operation S150 of FIG. 12, the bit-line sense amplifier 750 performs a sensing and restoring operation. For example, the isolation signal ISO may be logic high (H) and the offset cancellation signal OC may be logic low (L).

When the charge sharing operation described in FIG. 12C is performed, the voltage of the bit-line BL may be increased or decreased by a predetermined amount according to the data stored in the memory cell MC1. In this case, the first control signal LA is transitioned to the internal power supply voltage VINTA and the second control signal LAB is transitioned to the ground voltage VSS. Accordingly, the bit-line sense amplifier 750 may charge each of the voltages of the sensing bit-line SBL and the complementary sensing bit-line SBLB to the internal power supply voltage VINTA and discharge each of the voltages of the sensing bit-line SBL and the complementary sensing bit-line SBLB to the ground voltage VSS based on the voltage difference between the bit-line BL and the complementary bit-line BLB.

For example, when data having a value of '1' is stored in the memory cell MC1, the voltage on the sensing bit-line SBL may be increased to the internal power supply voltage VINTA and the voltage on the complementary sensing bit-line SBLB may be decreased to the ground voltage VSS during the sensing operation. On the other hand, when data having a value of '0' is stored in the memory cell MC1, the voltage on the sensing bit-line SBL may be decreased to the ground voltage VSS and the voltage on the complementary sensing bit-line SBLB may be increased to the internal power supply voltage VINTA.

Referring to FIG. 12E, in operation S150 of FIG. 12, the bit-line sense amplifier 750 performs a restoring operation. For example, the isolation signal ISO may be logic high (H), and the offset cancellation signal OC may be logic low (L).

The first and second isolation transistors ISO_1 and ISO_2 are turned on in response to the isolation signal ISO having a logic high level, and the first and second offset cancellation transistors OC_1 and OC_2 are turned off in response to the offset cancellation signal OC having a logic low level. In this case, the bit-line BL and the sensing bit-line SBL are connected by the first isolation transistor ISO_1, and the complementary bit-line BLB and the complementary sensing bit-line SBLB are connected by the second isolation transistor ISO_2. Accordingly, the voltage on the bit-line BL may be increased or decreased to a voltage level of the sensing bit-line SBL, and the voltage on the complementary bit-line BLB may be increased or decreased to a voltage level of the complementary sensing bit-line SBLB.

In some embodiments, a sensing bit-line pair SBL and SBLB of the bit-line sense amplifier 750 may be connected to a data line and data may be output to a local sense amplifier, a global sense amplifier, or the data I/O buffer 320 (see FIG. 3) through the data line after the sensing operation.

As described above, the bit-line sense amplifier 750 performs the pre-charging operation, the offset cancelling operation, the shifting operation and the sensing and restoring operation based on the equalizing signal PEQ, the isolation signal ISO, the offset cancellation signal OC, and the first and second control signals LA and LAB. In this case, the bit-line sense amplifier 750 may compensate the offset of the bit-line sense amplifier 750 through the offset cancelling operation and may shift voltage levels of the bit-line BL and the complementary bit-line BLB through the shifting operation while the N-type amplifier 765 may operate dominantly over the P-type amplifier 760. Therefore, a bit-line sense amplifier with enhanced performance and reduced power consumption maybe provided and a semiconductor memory device including the bit-line sense amplifier may be provided.

Figure 14:
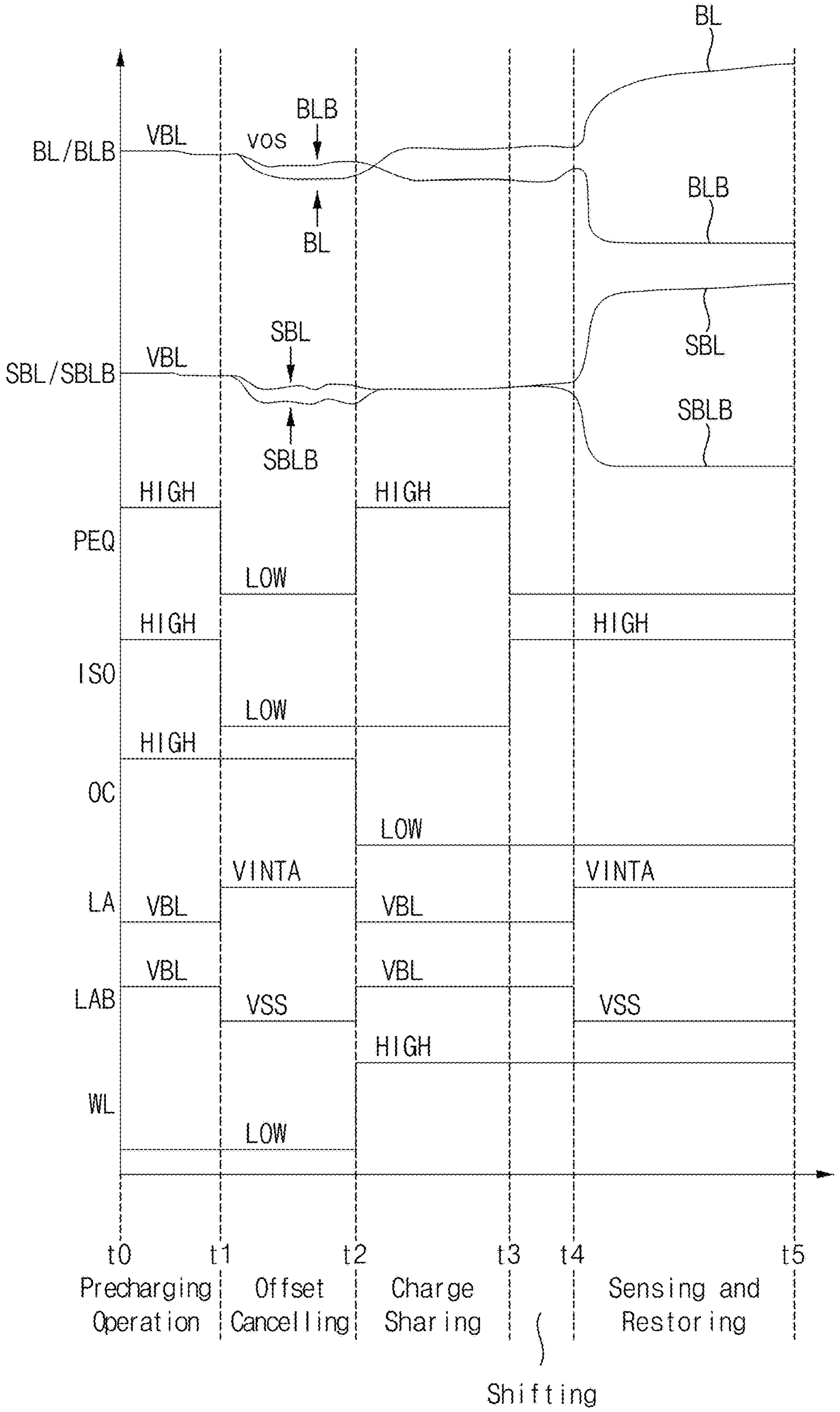
FIG. 14 is a timing diagram for describing operations of the bit-line sense amplifier in FIG. 6 according to example embodiments.

FIG. 14 is a timing diagram for describing the operations of the bit-line sense amplifier in FIG. 6 according to example embodiments.

An x-axis of FIG. 14 denotes time and a y-axis denotes a voltage level of signal. For example, it is assumed that the memory cell MC1 stores data having a value of '1' and a threshold voltage of the first NMOS transistor MN1 is greater than a threshold voltage of the second NMOS transistor MN2 by an offset voltage Vos.

Referring to FIG. 14, the bit-line sense amplifier 750 sequentially performs a pre-charging operation, an offset cancelling operation, a charge sharing operation, a shifting operation and a sensing and restoring operation.

In a precharge period corresponding to a first time interval t0~t1, the bit-line sense amplifier 750 perform a pre-charging operation. In this case, the equalizing signal PEQ, the isolation signal ISO and the offset cancellation signal OC are at a logic high level (denoted as 'HIGH'), and a bit-line pair BL and BLB and a sensing bit-line pair SBL and SBLB are precharged to the precharge voltage VBL.

In an offset cancellation period corresponding to a second time interval t1~t2, the bit-line sense amplifier 750 performs an offset cancelling operation. In this case, the equalizing signal PEQ and the isolation signal ISO become logic low. The first control signal LA is increased from the precharge voltage VBL to the internal power supply voltage VINTA and the second control signal LAB is reduced from the precharge voltage VBL to the ground voltage VSS (denoted as 'LOW'). The bit-line sense amplifier 750 may perform the offset cancelling operation based on the method described in FIGS. 11 and 12B. During the offset cancelling operation, the voltage on the sensing bit-line SBL and the complementary bit-line BLB may be greater than the voltage on the complementary sensing bit-line SBLB and the bit-line BL by the offset voltage Vos. Accordingly, the voltages on the bit-line BL and the complementary bit-line BLB have a difference by the offset voltage Vos, and thus the offset noise of the bit-line sense amplifier 750 may be cancelled.

In a charge sharing period corresponding to a third time interval t2~t3, the bit-line sense amplifier 750 performs a charge sharing operation. In this case, the equalizing signal PEQ becomes logic high, the isolation signal ISO and the offset cancellation signal OC become logic low, the word-line WL (corresponding to the first word-line WLi) connected to the memory cell MC1 is activated, and the charge sharing operation is performed between electric charges stored in the cell capacitor of the memory cell MC1 and electric charges stored in the bit-line BL. For example, the sensing bit-line SBL and the complementary sensing bit-line SBLB may be charged to the precharge voltage VBL based on the equalizing signal PEQ having a logic high level. When data having a value of '1' is stored in the memory cell MC1, a voltage level of the bit-line BL may be increased by a predetermined level during the charge sharing operation. In another embodiment, when data having a value of '0' is stored in the memory cell MC1, the voltage level of the bit-line BL may be reduced by a predetermined level during the charge sharing operation.

In a shifting period corresponding to a fourth time interval t3~t4, the bit-line sense amplifier 750 performs a shifting operation. In this case, the equalizing signal PEQ becomes logic low, the isolation signal ISO becomes logic high and the offset cancellation signal OC becomes a logic low (i.e., the offset cancellation signal OC is maintained at a logic low level).

The sensing bit-line SBL and the complementary sensing bit-line SBLB is connected to the bit-line BL and the complementary bit-line BLB, respectively, based on the isolation signal ISO having a logic high level, and voltage levels of the bit-line BL and the complementary bit-line BLB are increased by the precharge voltage VBL of the sensing bit-line SBL and the complementary sensing bit-line SBLB. In this case, the first control signal LA and the second control signal may be maintained at the precharge voltage VBL.

In a sensing and restoring period corresponding to a fifth time interval t4~t5, the bit-line sense amplifier 750 performs a sensing and restoring operation pre-sensing operation. In this case, the isolation signal ISO is maintained at a logic high level and first and second isolation transistors ISO_1 and ISO_2 are turned on. The bit-line pair BL and BLB and the sensing bit-line pair SBL and SBLB are respectively connected to each other, and the bit-line pair BL and BLB may be charged or discharged to the voltage level of the sensing bit-line pair SBL and SBLB.

In this case, the first control signal LA is transitioned to the internal power supply voltage VINTA and the second control signal LAB is transitioned to the ground voltage VSS. Accordingly, the bit-line sense amplifier 750 may charge each of the voltages of the sensing bit-line SBL and the complementary sensing bit-line SBLB to the internal power supply voltage VINTA and discharge each of the voltages of the sensing bit-line SBL and the complementary sensing bit-line SBLB to the ground voltage VSS based on the voltage difference between the bit-line BL and the complementary bit-line BLB.

Figure 15:
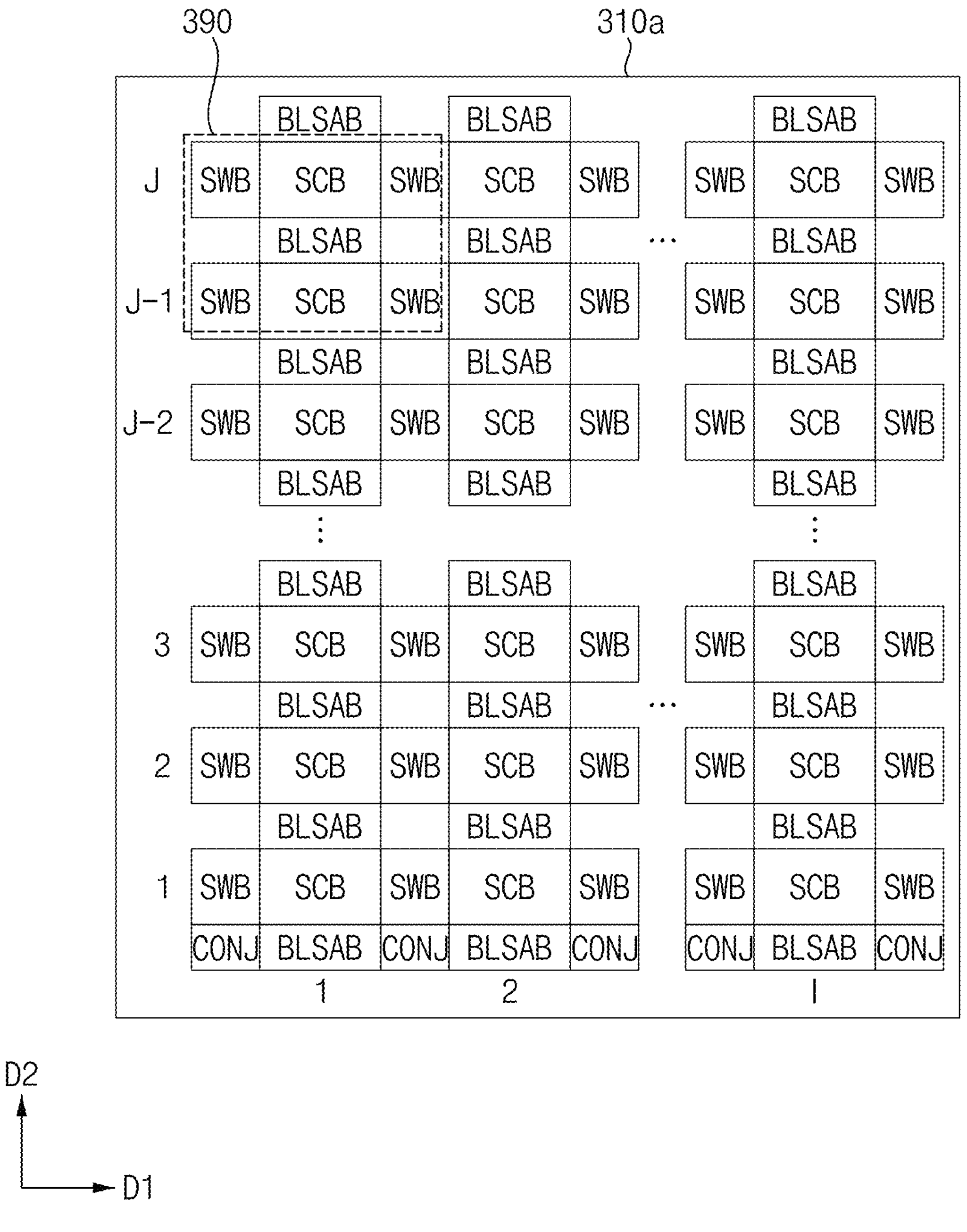
FIG. 15 illustrates an example of a first bank array in the semiconductor memory device of FIG. 3 according to example embodiments.

FIG. 15 illustrates an example of the first bank array in the semiconductor memory device of FIG. 3 according to example embodiments.

Referring to FIG. 15, in the first bank array 310*a*, I sub-array blocks SCB may be disposed in the first direction D1, and J sub-array blocks SCB may be disposed in the second direction D2 perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ.

A portion 390 in the first bank array 310*a* will be described with reference to FIG. 16 below.

Figure 16:
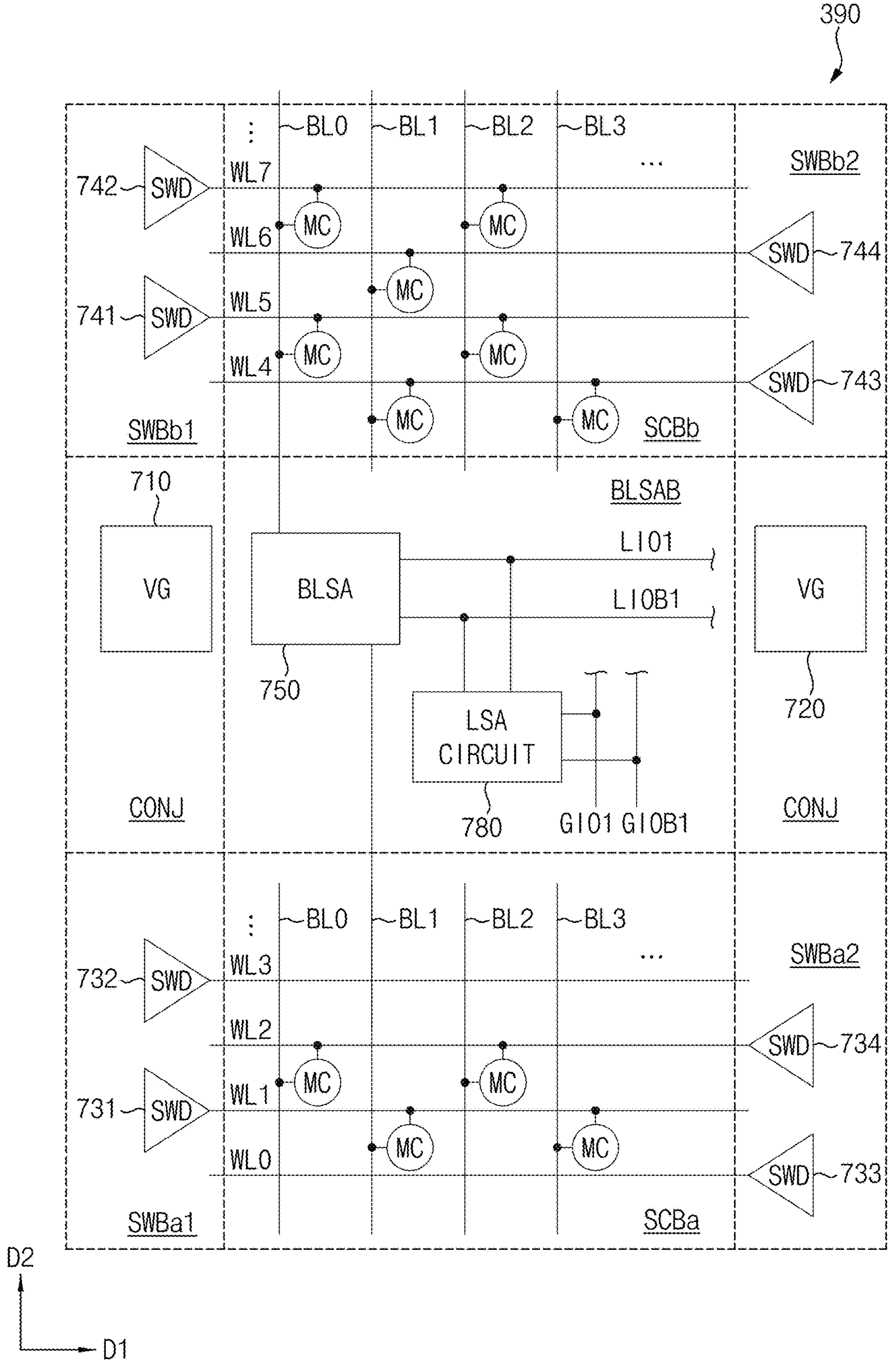
FIG. 16 illustrates a portion of the first bank array in FIG. 15 according to example embodiments.

FIG. 16 illustrates a portion of the first bank array in FIG. 16 according to example embodiments.

Referring to FIGS. 15 and 16, in the portion 390 of the first bank array 310*a*, sub-array blocks SCBa and SCBb, the bit-line sense amplifier regions BLSAB, four sub word-line driver regions SWBa1, SWBa2, SWBb1 and SWBb2 and two of the conjunction regions CONJ are disposed.

The sub-array block SCBa may include a plurality of word-lines WL0~WL3 extending in the first direction D1 and a plurality of bit-line BL0~BL3 extending in the second direction D2. The sub-array block SCBa may include a plurality of memory cells MCs disposed at intersections of the word-lines WL0~WL3 and the bit-line BL0~BL3. The sub-array block SCBb may include a plurality of word-lines WL4~WL7 extending in the first direction D1 and the plurality of bit-line BL0~BL3 extending in the second direction D2. The sub-array block SCBb may include a plurality of memory cells MCs disposed at intersections of the word-lines WL4~WL7 and the bit-line BL0~BL3.

With reference to FIG. 16, the sub word-line driver regions SWBa1 and SWBa2 may include a plurality of sub word-line drivers 731, 732, 733 and 734 that respectively drive the word-lines WL0~WL3. The sub word-line driver regions SWBb1 and SWBb2 may include a plurality of sub word-line drivers 741, 742, 743 and 744 that respectively drive the word-lines WL4~WL7.

The bit-line sense amplifier region BLSAB may include the bit-line sense amplifier 750 coupled to the bit-line BL0 in the sub array block SCBb and the bit-line BL1 in the sub array block SCBa, and a local sense amplifier LSA circuit 780. The bit-line sense amplifier 750 may sense and amplify a voltage difference between the bit-lines BL0 and BL1 to provide the amplified voltage difference to a local I/O line pair LIO1 and LIOB1. The local I/O line pair LIO1 and LIOB1 may correspond to the sensing bit-line SBL and the complementary sensing bit-line SBLB in FIG. 6. The bit-line BL1 in the sub array block SCBa may correspond to the complementary bit-line BLB in FIG. 6.

The local sense amplifier circuit 780 may control electrical connection between the local I/O line pair LIO1 and LIOB1 and a global I/O line pair GIO1 and GIOB1.

As illustrated in FIG. 16, the conjunction regions CONJ may be disposed adjacent to the bit-line sense amplifier region BLSAB and the sub word-line driver regions SWBa1, SWBb1, SWBa2 and SWBb2. Voltage generators VGs 710 and 720 may be disposed in the conjunction regions CONJ.

Figure 17:
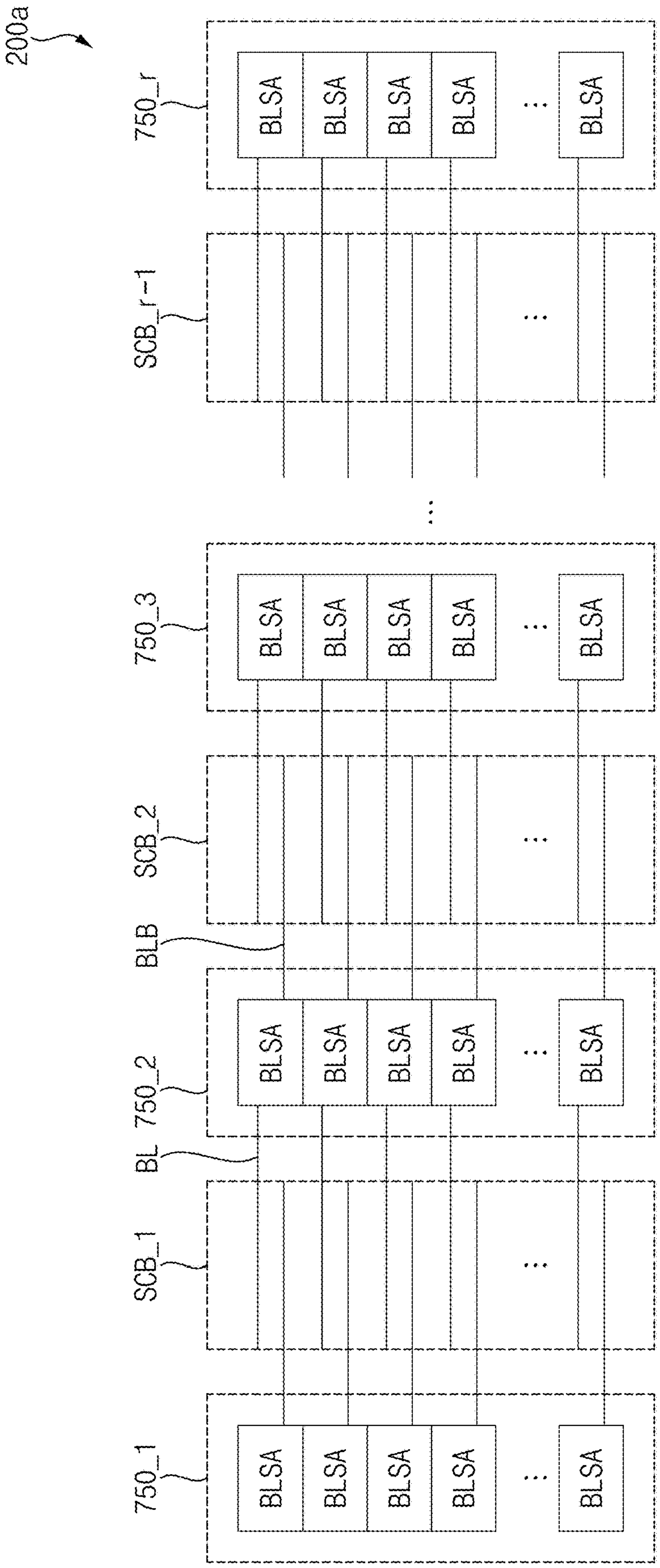
FIG. 17 is a block diagram illustrating a semiconductor memory device that employs a bit-line sense amplifier according to example embodiments.

FIG. 17 is a block diagram illustrating a semiconductor memory device that employs a bit-line sense amplifier according to example embodiments.

Referring to FIG. 17, a semiconductor memory device 200*a* may include a plurality of sub array blocks SCB_1, SCB_2, . . . , and SCB_*r*−1 (r is an integer greater than three) and a plurality of bit-line sense amplifiers 750_1, 750_2, 750_3, . . . , and 750_*r*.

Each of the plurality of bit-line sense amplifiers 750_1, 750_2, 750_3, . . . , and 750_*r* may include a plurality of bit-line sense amplifiers BLSA. Each of the plurality of bit-line sense amplifiers BLSA may employ the bit-line sense amplifier 750 in FIG. 6.

Each of the plurality of bit-line amplifiers BLSA is a circuit element that operates when the memory device 200*a* operates, and is distinguished from dummy sense amplifiers 750_1 and 750_*r* implemented in a region other than a region in which bit-line sense amplifiers 750_2~750_*r*−1 are implemented.

In example embodiments, an odd bit-line of the sub array block SCB_1 may be connected to a bit-line BL, and an even bit-line may be connected to a complementary bit-line BLB. The bit-line sense amplifier 750_2 may be connected to each of the bit-line pairs BL and BLB in both directions.

Figure 18:
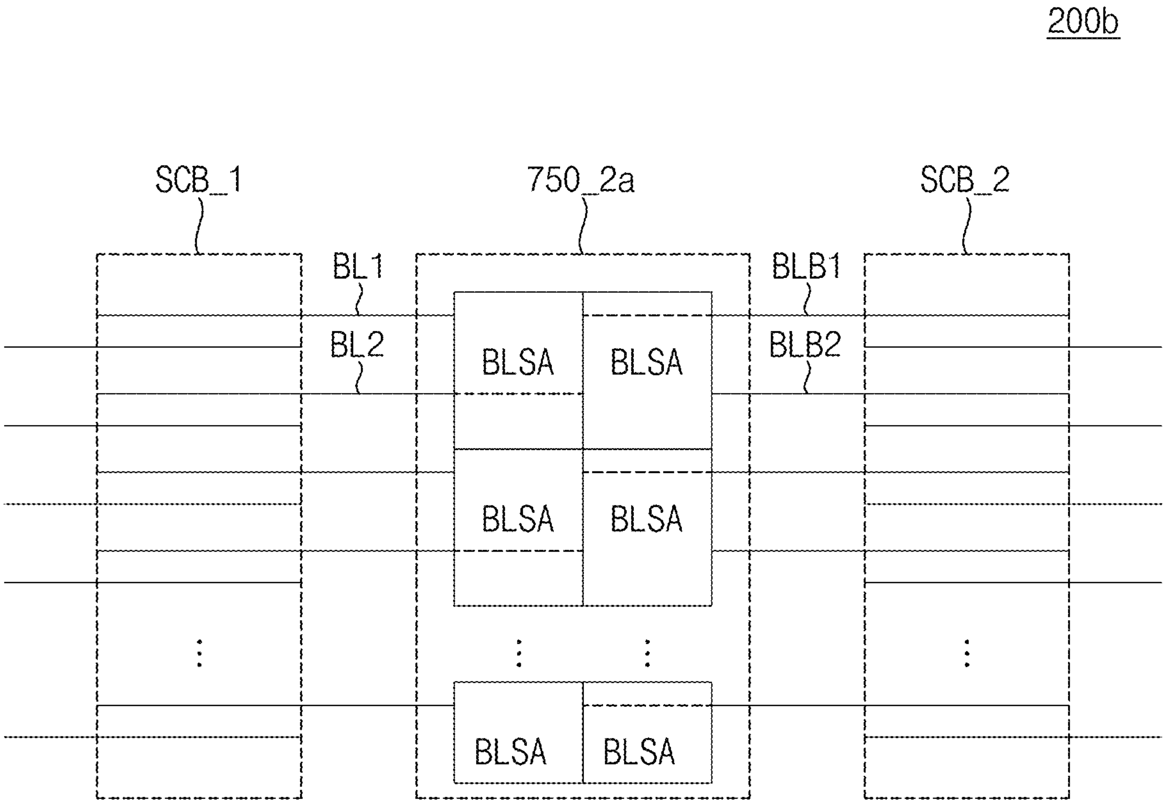
FIGS. 18 and 19 are diagrams illustrating a semiconductor memory device that employs a bit-line sense amplifier according to example embodiments.
Figure 19:
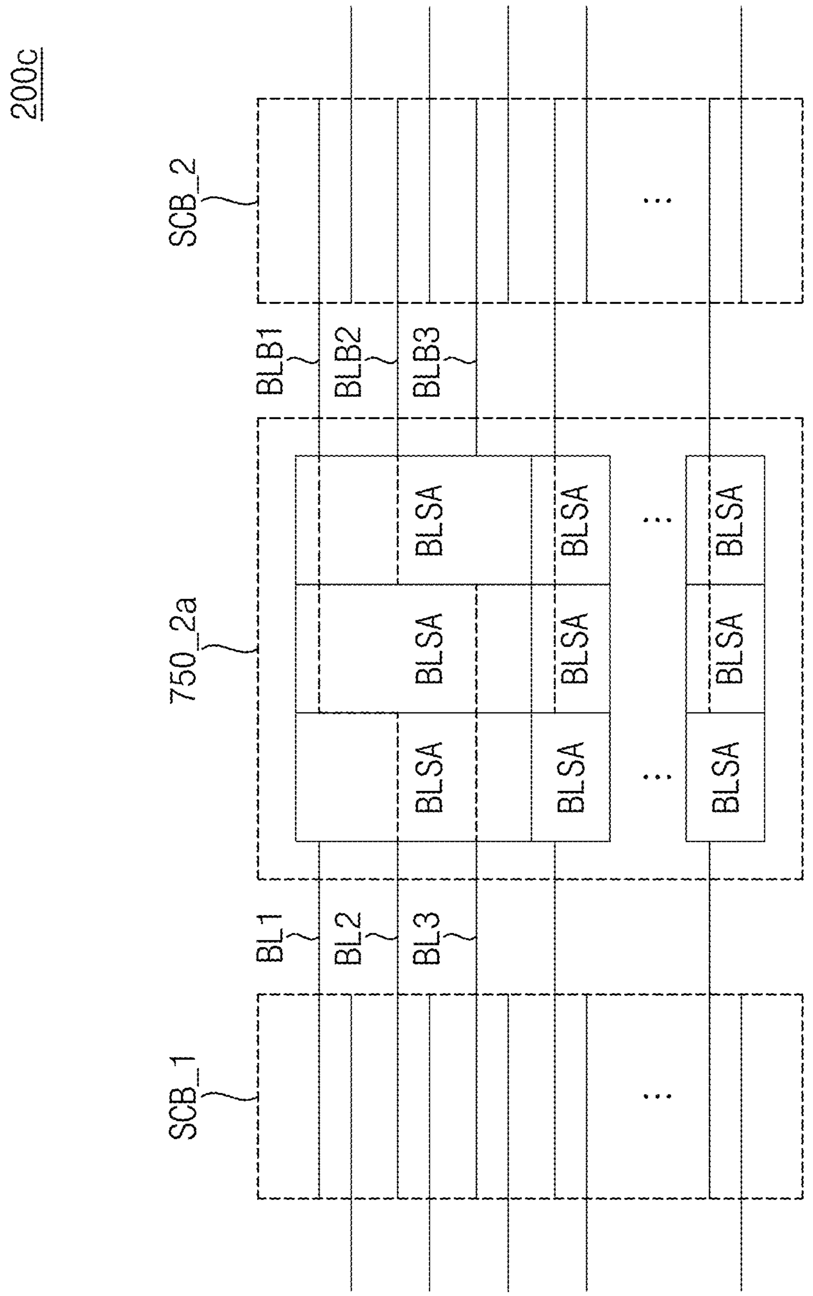

FIGS. 18 and 19 are diagrams illustrating a semiconductor memory device that employs a bit-line sense amplifier according to example embodiments.

FIGS. 18 and 19 correspond to first and second sub array blocks SCB_1 and SCB_2 and bit-line sense amplifiers 750_2*a* which are some of the plurality of sub array blocks SCB_1, SCB_2, . . . , and SCB_*r*−1 and the plurality of bit-line sense amplifiers 750_1, 750_2, 750_3, . . . , and 750_*r* described above in FIG. 17. Each of the bit-line sense amplifiers 750_2*a* may include the plurality of bit-line sense amplifiers BLSA.

Unlike the semiconductor memory device 200*a* of FIG. 17, in the semiconductor memory device 200*b* of FIG. 18, two bit-line sense amplifiers BLSA in the second bit-line sense amplifiers 750_2*a* are placed to be adjacent to each other. The two bit-line sense amplifiers BLSA may be connected to first and second bit-lines BL1 and BL2, and first and second complementary bit-lines BLB1 and BLB2. One of the two bit-line sense amplifiers BLSA may detect the voltage change of the first bit-line pairs BL1 and BLB1, and the other one may detect the voltage change of the second bit-line pairs BL2 and BLB2.

Unlike the semiconductor memory device 200*a* of FIG. 17, in the semiconductor memory device 200*c* of FIG. 19, three bit-line sense amplifiers BLSA in the second bit-line sense amplifier 750_2*a* are adjacent to each other (e.g., are placed side-by-side). The three bit-line sense amplifiers BLSA may be connected to first to third bit-lines BL1, BL2 and BL3 and first to third complementary bit-lines BLB1, BLB2 and BLB3. Each of the three bit-line sense amplifiers BLSA may detect the voltage change of each of the first to third bit-line pairs (BL1 and BLB1), (BL2 and BLB2), and (BL3 and BLB3).

The semiconductor memory devices 200*b* and 200*c* of FIGS. 18 and 19 may be selectively applied according to the tendency in which the size of the unit cell decreases due to the miniaturization of the design-rules according to the high integration of memory cell elements. According to example embodiments, r bit-line sense amplifiers BLSA are placed adjacent to each other, and the r bit-line sense amplifiers BLSA are connected to first to r-th bit-lines BL1 to BLr and first to r-th complementary bit-lines BLB1 to BLBr, and each of the r bit-line sense amplifiers BLSA may detect the voltage change of each of the first to r-th bit-line pairs (BL1 and BLB1) to (BLr and BLBr).

Figure 20:
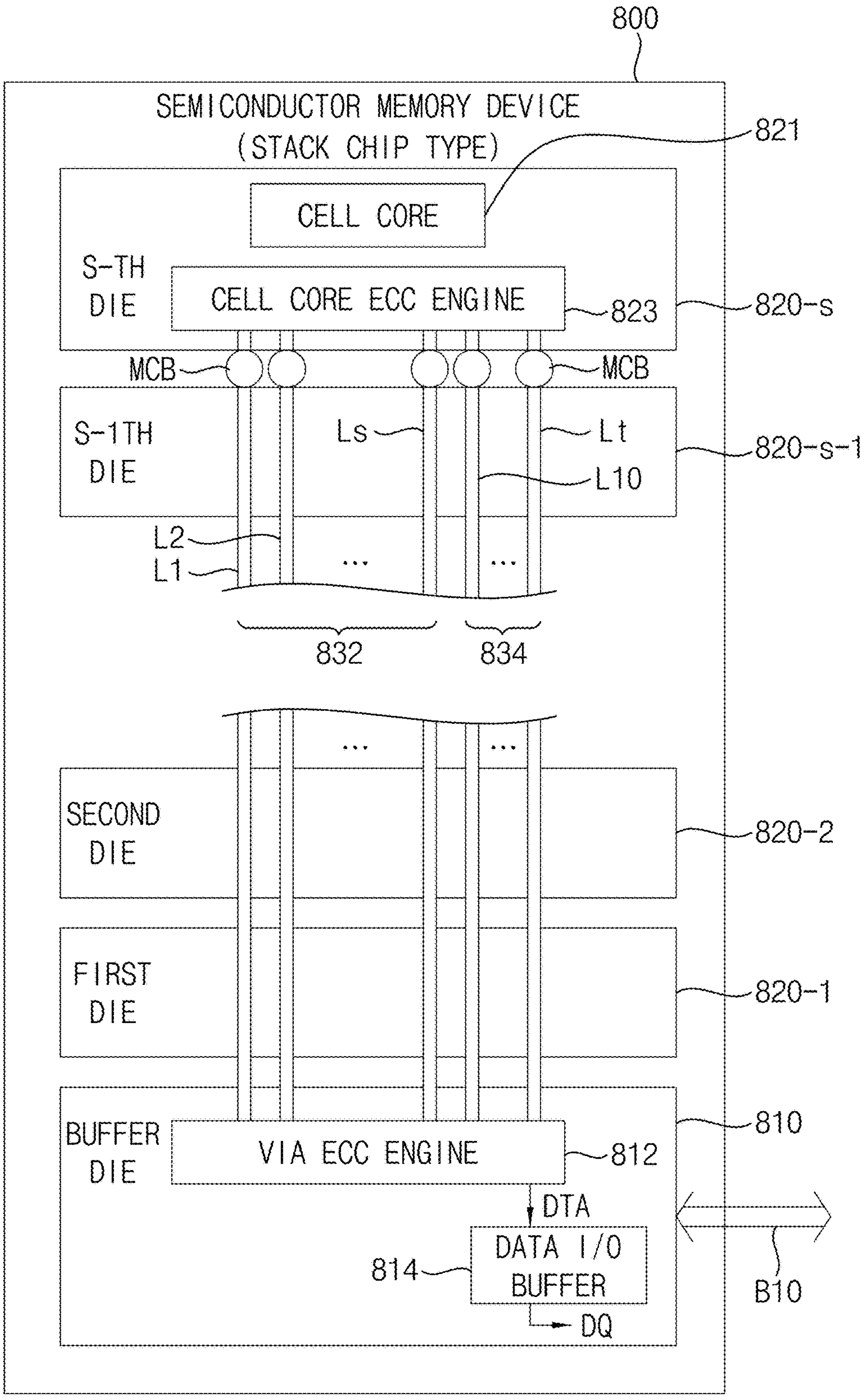
FIG. 20 is a block diagram illustrating a semiconductor memory device according to example embodiments.

FIG. 20 is a block diagram illustrating a semiconductor memory device according to example embodiments.

Referring to FIG. 20, a semiconductor memory device 800 may include at least one buffer die 810 and a plurality of memory dies 820-1 to 820-*s* (s is a natural number equal to or greater than three) providing a soft error analyzing and correcting function in a stacked chip structure.

The plurality of memory dies 820-1 to 820-*s* are stacked on the buffer die 810 and conveys data through a plurality of through substrate via (e.g., through silicon via (TSV)) lines.

Each of the memory dies 820-1 to 820-*s* may include a cell core 821 to store data and a cell core ECC engine 823 which generates transmission parity bits (i.e., transmission parity data) based on transmission data to be sent to the at least one buffer die 810. The cell core 821 may include a plurality of memory cells having DRAM cell structure. The cell core 821 may include a bit-line sense amplifier that detects a voltage difference between a bit-line and a complementary bit-line connected to the memory cells.

The bit-line sense amplifier of the cell core 821 may correspond to the bit-line sense amplifier 750 Of FIG. 6. The bit-line sense amplifier of the cell core 821 may include an amplifying circuit that includes a P-type amplifier connected to a bit-line and a complementary bit-line and an N-type amplifier connected to a sensing bit-line and a complementary sensing bit-line, and an isolation circuit connected between the bit-line and the sensing bit-line and between the complementary bit-line and the complementary sensing bit-line. The isolation circuit may connect the sensing bit-line and the complementary sensing bit-line to the bit-line and the complementary bit-line, respectively, based on an isolation signal. Because the bit-line and the complementary bit-line are connected to drains of isolation transistors in the isolation circuit, a voltage level of each of the bit-line and the complementary bit-line may swing between the power supply voltage (or the internal power supply voltage) and a ground voltage when the isolation signal, which is applied to gates of the isolation transistors, has a voltage level of the power supply voltage (or the internal power supply voltage).

The buffer die 810 may include a via ECC engine 812 which corrects a transmission error using the transmission parity bits when a transmission error is detected from the transmission data received through the TSV liens and generates error-corrected data.

The buffer die 810 may further include a data I/O buffer 814. The data I/O buffer 814 may generate the data signal DQ by sampling data DTA from the via ECC engine 812 and may output the data signal DQ to an outside.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-*p* (where, p is a natural number) before the transmission data is sent.

A data TSV line group 832 which is formed at one memory die 820-*s* may include TSV lines L1, and L2 to Ls (s is a natural number equal to or greater than three), and a parity TSV line group 834 may include TSV lines L10 to Lt (t is a natural number equal to or greater than eleven). The TSV lines L1, and L2 to Ls of the data TSV line group 832 and the parity TSV lines L10 to Lt of the parity TSV line group 834 may be connected to micro bumps MCB which are correspondingly formed among the memory dies 820-1 to 820-*s*.

The semiconductor memory device 800 may have a three-dimensional (3D) chip structure or a 2.5D chip structure to communicate with the host through a data bus B10. The buffer die 810 may be connected to the memory controller through the data bus B10.

According to example embodiments, as illustrated in FIG. 20, the cell core ECC engine 823 may be included in the memory die, the via ECC engine 812 may be included in the buffer die 810. Accordingly, it may be possible to detect and correct soft data fail. The soft data fail may include a transmission error which is generated due to noise when data is transmitted through TSV lines.

Figure 21:
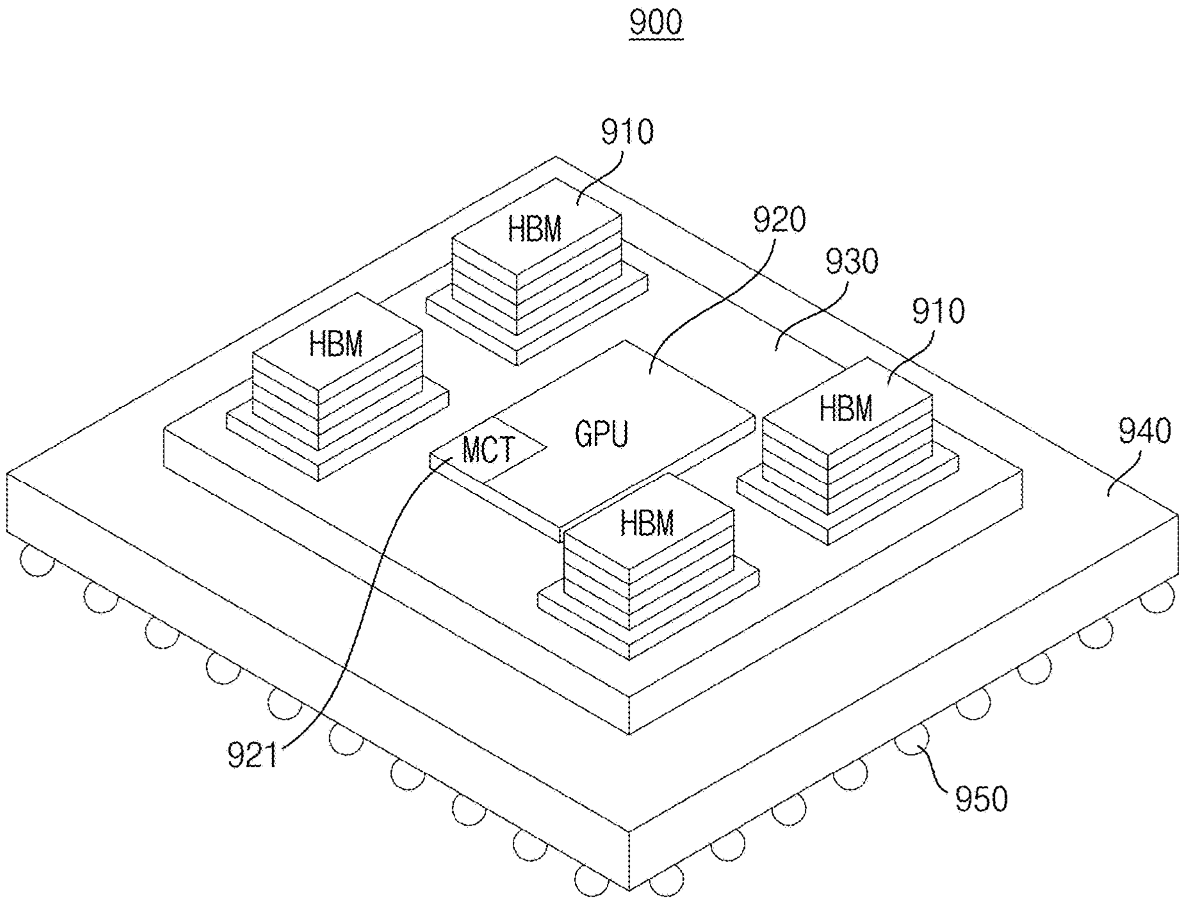
FIG. 21 is a configuration diagram illustrating a semiconductor package including the stacked memory device according to example embodiments.

FIG. 21 is a configuration diagram illustrating a semiconductor package including the stacked memory device according to example embodiments.

Referring to FIG. 21, a semiconductor package 900 may include one or more stacked memory devices 910 and a graphic processing unit (GPU) 920.

The one or more stacked memory devices 910 and the GPU 920 may be mounted on an interposer 930, and the interposer 930 on which the one or more stacked memory devices 910 and the GPU 920 are mounted may be mounted on a package substrate 940 mounted on solder balls 950. The GPU 920 may include a memory controller MCT 921, and for example, the GPU 920 may be implemented as an application processor (AP).

A stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies include a cell core and the cell core may include a bit-line sense amplifier that detects a voltage difference between a bit-line and a complementary bit-line. The stacked memory device 910 may correspond to the semiconductor memory device 800 of FIG. 20.

The one or more stacked memory devices 910 may be mounted on the interposer 930, and the GPU 920 may communicate with the one or more stacked memory devices 910. For example, each of the one or more stacked memory devices 910 and the GPU 920 may include a physical region, and communication may be performed between the one or more stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of the present disclosure may be applied to systems using semiconductor memory devices that employ volatile memory cells. For example, aspects of the present disclosure may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present invention as defined in the claims.

What is claimed is:

1. A semiconductor memory device comprising:

a first memory cell connected to a first word-line and a bit-line;

a second memory cell connected to a second word-line and a complementary bit-line; and a bit-line sense amplifier connected to the bit-line and the complementary bit-line, and the bit-line sense amplifier comprising:

an amplifying circuit including a P-type amplifier directly connected to the bit-line and the complementary bit-line and an N-type amplifier connected to a sensing bit-line and a complementary sensing bit-line, and the amplifying circuit configured to:

sense a voltage difference between the bit-line and the complementary bit-line based on a first control signal and a second control signal, and adjust a voltage of the sensing bit-line and the complementary sensing bit-line based on the voltage difference;

an offset cancellation circuit configured to connect the bit-line and the complementary bit-line to the complementary sensing bit-line and the sensing bit-line, respectively, based on an offset cancellation signal;

an equalizer configured to provide a precharge voltage to the sensing bit-line and the complementary sensing bit-line based on an equalizing signal; and an isolation circuit connected between the bit-line and the sensing bit-line and between the complementary bit-line and the complementary sensing bit-line, and the isolation circuit configured to:

connect the sensing bit-line and the complementary sensing bit-line equalized with the precharge voltage to the bit-line and the complementary bit-line, respectively, based on an isolation signal, wherein, in a charge sharing period, the equalizer is configured to provide the precharge voltage to the sensing bit-line and the complementary sensing bit-line based on the equalizing signal, and wherein, in a shifting period after the charge sharing period, the isolation circuit is configured to increase voltage levels of the bit-line and the complementary bit-line by the precharge voltage of the sensing bit-line and the complementary sensing bit-line based on the isolation signal.

2. The semiconductor memory device of claim 1, wherein the P-type amplifier includes:

a first p-channel metal-oxide semiconductor (PMOS) transistor connected to a first supply line at a first node at which the first control signal is applied and connected to the bit-line at a third node, and including a gate connected to the complementary bit-line at a fourth node, and a second PMOS transistor connected between the first supply line and the fourth node and including a gate connected to the third node, and wherein the N-type amplifier includes:

a first n-channel metal-oxide semiconductor (NMOS) transistor connected to a second supply line at a second node at which the second control signal is applied and connected to the sensing bit-line at a fifth node, and including a gate connected to the fourth node, and a second NMOS transistor connected to the second supply line at the second node and connected to the complementary sensing bit-line at a sixth node, and including a gate connected to the third node.

3. The semiconductor memory device of claim 2, wherein the equalizer includes:

a first equalizing transistor connected between a first precharge voltage node at which the precharge voltage is applied and the fifth node, and including a gate configured to receive the equalizing signal, and a second equalizing transistor connected between a second precharge voltage node at which the precharge voltage is applied and the sixth node, and including a gate configured to receive the equalizing signal, and wherein the isolation circuit includes:

a first isolation transistor connected between the third node and the fifth node, and including a gate configured to receive the isolation signal, and a second isolation transistor connected between the fourth node and the sixth node, and including a gate configured to receive the isolation signal.

4. The semiconductor memory device of claim 3, wherein, in the charge sharing period, the first equalizing transistor and the second equalizing transistor are configured to equalize the sensing bit-line and the complementary sensing bit-line with the precharge voltage based on the equalizing signal, and wherein, in the shifting period, the first isolation transistor and the second isolation transistor are configured to increase voltage levels of the third node and the fourth node, respectively, by connecting the sensing bit-line and the complementary sensing bit-line to the bit-line and the complementary sensing bit-line, respectively, based on the isolation signal.

5. The semiconductor memory device of claim 4, wherein, in the shifting period, the first isolation transistor and the second isolation transistor are turned-on in response to the isolation signal having a logic high level.

6. The semiconductor memory device of claim 3, wherein the offset cancellation circuit includes:

a first offset cancellation transistor connected between the fifth node and the fourth node, and including a gate configured to receive the offset cancellation signal, and a second offset cancellation transistor connected between the sixth node and the third node, and including a gate configured to receive the offset cancellation signal.

7. The semiconductor memory device of claim 6, wherein the bit-line sense amplifier further comprises:

a first active region including a first region and a second region adjacent to the first region, wherein, in a plan view:

the first region includes a horseshoe-shaped portion of the first active region, and extends in a first direction, and the second region includes rectangular portions extending in the first direction, of the first active region that are spaced apart from each other in a second direction crossing the first direction;

a second active region including a rectangular shape, the second active region being spaced apart from a first side of the first active region in the first direction;

a third active region including a rectangular shape, the third active region being spaced apart from a second side of the first active region in the first direction;

a first gate pattern extending in the second direction on the first region;

a second gate pattern and a third gate pattern that extend in the second direction on the second region and are spaced apart from each other in the first direction;

a fourth gate pattern having a rectangular shape on the second active region; and a fifth gate pattern having a rectangular shape on the third active region.

8. The semiconductor memory device of claim 7, wherein the first region and the first gate pattern correspond to one of the first and second isolation transistors, and the first gate pattern is configured to receive the isolation signal.

9. The semiconductor memory device of claim 7, wherein the second region and the second gate pattern correspond to one of the first and second equalizing transistors, and the second gate pattern is configured to receive the equalizing signal.

10. The semiconductor memory device of claim 7, wherein the second region and the third gate pattern correspond to one of the first and second offset cancellation transistors, and the third gate pattern is configured to receive the offset cancellation signal.

11. The semiconductor memory device of claim 7, wherein the second active region and the fourth gate pattern correspond to one of the first and second NMOS transistors, and wherein the third active region and the fifth gate pattern correspond to one of the first and second PMOS transistors.

12. The semiconductor memory device of claim 7, wherein each of the first active region and the second active region is N-type and the third active region is P-type.

13. The semiconductor memory device of claim 1, wherein the P-type amplifier is connected to:

a first supply line at a first node at which the first control signal is applied, the bit-line at a third node, and the complementary bit-line at a fourth node, and wherein the N-type amplifier is connected to:

a second supply line at a second node at which the second control signal is applied, the sensing bit-line at a fifth node, and the complementary sensing bit-line at a sixth node.

14. The semiconductor memory device of claim 13, wherein, during a precharge period:

the equalizer is configured to provide the precharge voltage to the sensing bit-line and the complementary sensing bit-line, based on the equalizing signal, the offset cancellation circuit is configured to connect the fifth node to the fourth node, and connect the sixth node to the third node, based on the offset cancellation signal, and the isolation circuit is configured to connect the fifth node to the third node, and connect the sixth node to the fourth node, based on the isolation signal.

15. The semiconductor memory device of claim 13, wherein, during an offset cancellation period:

the equalizer is configured to disconnect a first precharge voltage node at which the precharge voltage is applied from the sensing bit-line and disconnect a second precharge voltage node at which the precharge voltage is applied from the complementary sensing bit-line, based on the equalizing signal, the offset cancellation circuit is configured to connect the fifth node to the fourth node, and connect the sixth node to the third node, based on the offset cancellation signal, and the isolation circuit is configured to disconnect the fifth node from the third node, and disconnect the sixth node from the fourth node, based on the isolation signal.

16. The semiconductor memory device of claim 15, wherein, during the charge sharing period:

the offset cancellation circuit is configured to disconnect the fifth node from the fourth node, and disconnect the sixth node to the third node, based on the offset cancellation signal, and the isolation circuit is configured to disconnect the fifth node from the third node, and disconnect the sixth node from the fourth node, based on the isolation signal.

17. The semiconductor memory device of claim 13, wherein, during the shifting period, the equalizer is configured to disconnect a first precharge voltage node at which the precharge voltage is applied from the sensing bit-line and disconnect a second precharge voltage node at which the precharge voltage is applied from the complementary sensing bit-line, based on the equalizing signal, the offset cancellation circuit is configured to disconnect the fifth node from the fourth node, and disconnect the sixth node from the third node, based on the offset cancellation signal, and the isolation circuit is configured to connect the fifth node to the third node, and connect the sixth node to the fourth node, based on the isolation signal.

18. A semiconductor memory device comprising:

a first memory cell connected to a first word-line and a bit-line;

a second memory cell connected to a second word-line and a complementary bit-line;

a bit-line sense amplifier connected to the bit-line and the complementary bit-line, and the bit-line sense amplifier configured to:

sense a voltage difference between the bit-line and the complementary bit-line, and amplify the voltage difference; and a timing control circuit configured to control an operation of the bit-line sense amplifier based on internal command signals, wherein the bit-line sense amplifier comprises:

an amplifying circuit including a P-type amplifier directly connected to the bit-line and the complementary bit-line and an N-type amplifier connected to a sensing bit-line and a complementary sensing bit-line, the amplifying circuit configured to:

sense the voltage difference between the bit-line and the complementary bit-line based on a first control signal and a second control signal, and adjust a voltage of the sensing bit-line and the complementary sensing bit-line based on the voltage difference;

an offset cancellation circuit configured to connect the bit-line and the complementary bit-line to the complementary sensing bit-line and the sensing bit-line, respectively, based on an offset cancellation signal;

an equalizer configured to provide a precharge voltage to the sensing bit-line and the complementary sensing bit-line based on an equalizing signal, in a charge sharing period; and an isolation circuit connected between the bit-line and the sensing bit-line and between the complementary bit-line and the complementary sensing bit-line, and the isolation circuit configured to:

in a shifting period after the charge sharing period, connect the sensing bit-line and the complementary sensing bit-line equalized with the precharge voltage to the bit-line and the complementary bit-line, respectively, based on an isolation signal.

19. The semiconductor memory device of claim 18, wherein the P-type amplifier includes:

a first p-channel metal-oxide semiconductor (PMOS) transistor connected to a first supply line at a first node at which the first control signal is applied and connected to the bit-line at a third node, and including a gate connected to the complementary bit-line at a fourth node, and a second PMOS transistor connected between the first supply line and the fourth node, and including a gate connected to the third node, wherein the N-type amplifier includes:

a first n-channel metal-oxide semiconductor (NMOS) transistor connected to a second supply line at a second node at which the second control signal is applied and connected to the sensing bit-line at a fifth node, and including a gate connected to the fourth node, and a second NMOS transistor connected to the second supply line at the second node and connected to the complementary sensing bit-line at a sixth node, and including a gate connected to the third node, wherein the equalizer includes:

a first equalizing transistor connected between a first precharge voltage node at which the precharge voltage is applied and the fifth node, and including a gate configured to receive the equalizing signal, and a second equalizing transistor connected between a second precharge voltage node at which the precharge voltage is applied and the fifth node, and including a gate configured to receive the equalizing signal, and wherein the isolation circuit includes:

a first isolation transistor connected between the third node and the fifth node, and including a gate configured to receive the isolation signal, and a second isolation transistor connected between the fourth node and the sixth node, and including a gate configured to receive the isolation signal.

20. A semiconductor memory device comprising:

a first memory cell connected to a first word-line and a bit-line;

a second memory cell connected to a second word-line and a complementary bit-line;

a bit-line sense amplifier connected to the bit-line and the complementary bit-line, and the bit-line sense amplifier comprising:

an amplifying circuit including a P-type amplifier directly connected to the bit-line and the complementary bit-line and an N-type amplifier connected to a sensing bit-line and a complementary sensing bit-line, and the amplifying circuit configured to:

sense a voltage difference between the bit-line and the complementary bit-line based on a first control signal and a second control signal, and adjust a voltage of the sensing bit-line and the complementary sensing bit-line based on the voltage difference;

an offset cancellation circuit configured to connect the bit-line and the complementary bit-line to the complementary sensing bit-line and the sensing bit-line, respectively, based on an offset cancellation signal;

an equalizer configured to provide a precharge voltage to the sensing bit-line and the complementary sensing bit-line based on an equalizing signal; and an isolation circuit connected between the bit-line and the sensing bit-line and between the complementary bit-line and the complementary sensing bit-line, and the isolation circuit configured to:

connect the sensing bit-line and the complementary sensing bit-line equalized with the precharge voltage to the bit-line and the complementary bit-line, respectively, based on an isolation signal, wherein the P-type amplifier is connected to:

a first supply line at a first node at which the first control signal is applied, the bit-line at a third node, and the complementary bit-line at a fourth node, wherein the N-type amplifier is connected to:

a second supply line at a second node at which the second control signal is applied, the sensing bit-line at a fifth node, and the complementary sensing bit-line at a sixth node, wherein the equalizer comprises:

a first equalizing transistor connected between a first precharge voltage node at which the precharge voltage is applied and the fifth node, and including a gate configured to receive the equalizing signal; and a second equalizing transistor connected between a second precharge voltage node at which the precharge voltage is applied and the sixth node, and including a gate configured to receive the equalizing signal, and wherein the isolation circuit comprises:

a first isolation transistor connected between the third node and the fifth node, and including a gate configured to receive the isolation signal; and a second isolation transistor connected between the fourth node and the sixth node, and including a gate configured to receive the isolation signal.

* * * * *